United States Patent
Su et al.

(10) Patent No.: US 9,887,206 B2
(45) Date of Patent: Feb. 6, 2018

(54) METHOD OF MAKING SPLIT GATE NON-VOLATILE MEMORY CELL WITH 3D FINFET STRUCTURE

(71) Applicant: Silicon Storage Technology, Inc., San Jose, CA (US)

(72) Inventors: Chien-Sheng Su, Saratoga, CA (US); Jeng-Wei Yang, Zhubei (TW); Man-Tang Wu, Hsinchu County (TW); Chun-Ming Chen, New Taipei (TW); Hieu Van Tran, San Jose, CA (US); Nhan Do, Saratoga, CA (US)

(73) Assignee: Silicon Storage Technology, Inc., San Jose, CA (US)

(*) Notice: Subject to any disclaimer, the term of this patent is extended or adjusted under 35 U.S.C. 154(b) by 0 days.

(21) Appl. No.: 15/453,829

(22) Filed: Mar. 8, 2017

(65) Prior Publication Data
US 2017/0179141 A1   Jun. 22, 2017

Related U.S. Application Data

(62) Division of application No. 15/050,309, filed on Feb. 22, 2016, now Pat. No. 9,634,018.

(60) Provisional application No. 62/134,489, filed on Mar. 17, 2015.

(51) Int. Cl.
| | |
|---|---|
| *H01L 21/336* | (2006.01) |
| *H01L 27/11521* | (2017.01) |
| *H01L 21/28* | (2006.01) |
| *H01L 29/66* | (2006.01) |
| *H01L 29/08* | (2006.01) |
| *H01L 29/78* | (2006.01) |
| *H01L 29/788* | (2006.01) |

(52) U.S. Cl.
CPC .. *H01L 27/11521* (2013.01); *H01L 21/28273* (2013.01); *H01L 29/0847* (2013.01); *H01L 29/66795* (2013.01); *H01L 29/66825* (2013.01); *H01L 29/7856* (2013.01); *H01L 29/7881* (2013.01)

(58) Field of Classification Search
CPC .................. H01L 27/11521; H01L 29/66825
USPC .......................................................... 438/259
See application file for complete search history.

(56) References Cited

U.S. PATENT DOCUMENTS

| | | |
|---|---|---|
| 5,029,130 A | 7/1991 | Yeh et al. |
| 7,315,056 B2 | 1/2008 | Klinger |
| 7,410,913 B2 | 8/2008 | Lee et al. |
| 7,423,310 B2 | 9/2008 | Verhoeven et al. |
| 8,154,075 B2 | 4/2012 | Nakagawa et al. |
| 8,461,640 B2 | 6/2013 | Hu et al. |

(Continued)

*Primary Examiner* — Anthony Ho
(74) *Attorney, Agent, or Firm* — DLA Piper LLP (US)

(57) ABSTRACT

A non-volatile memory cell, and method of making, that includes a semiconductor substrate having a fin shaped upper surface with a top surface and two side surfaces. Source and drain regions are formed in the fin shaped upper surface portion with a channel region there between. A conductive floating gate includes a first portion extending along a first portion of the top surface, and second and third portions extending along first portions of the two side surfaces, respectively. A conductive control gate includes a first portion extending along a second portion of the top surface, second and third portions extending along second portions of the two side surfaces respectively, a fourth portion extending up and over at least some of the floating gate first portion, and fifth and sixth portions extending out and over at least some of the floating gate second and third portions respectively.

5 Claims, 33 Drawing Sheets

(56) References Cited

U.S. PATENT DOCUMENTS

| | | |
|---|---|---|
| 2007/0054448 A1 | 3/2007 | Choi |
| 2009/0081835 A1 | 3/2009 | Kim |
| 2014/0264539 A1 | 9/2014 | Do et al. |

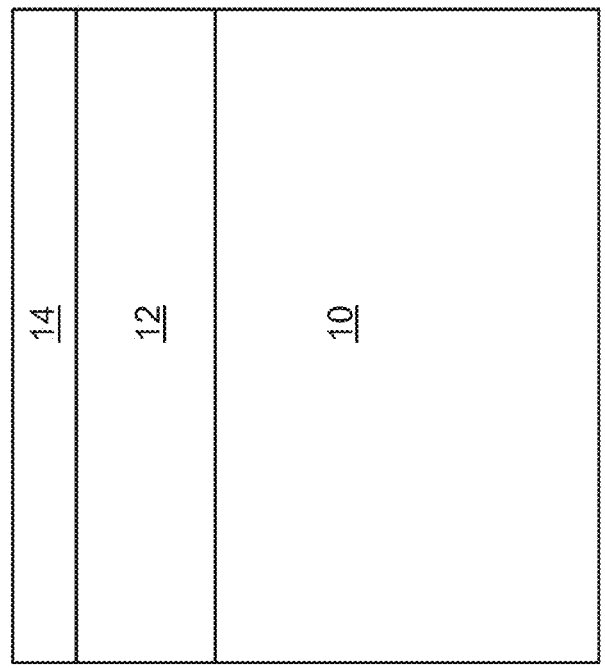
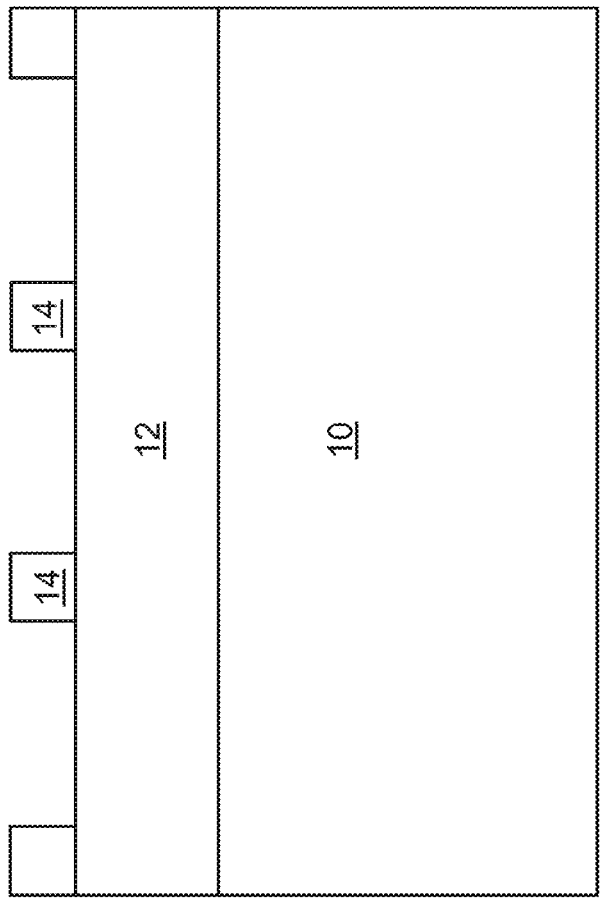
FIG. 1G
FIG. 2G

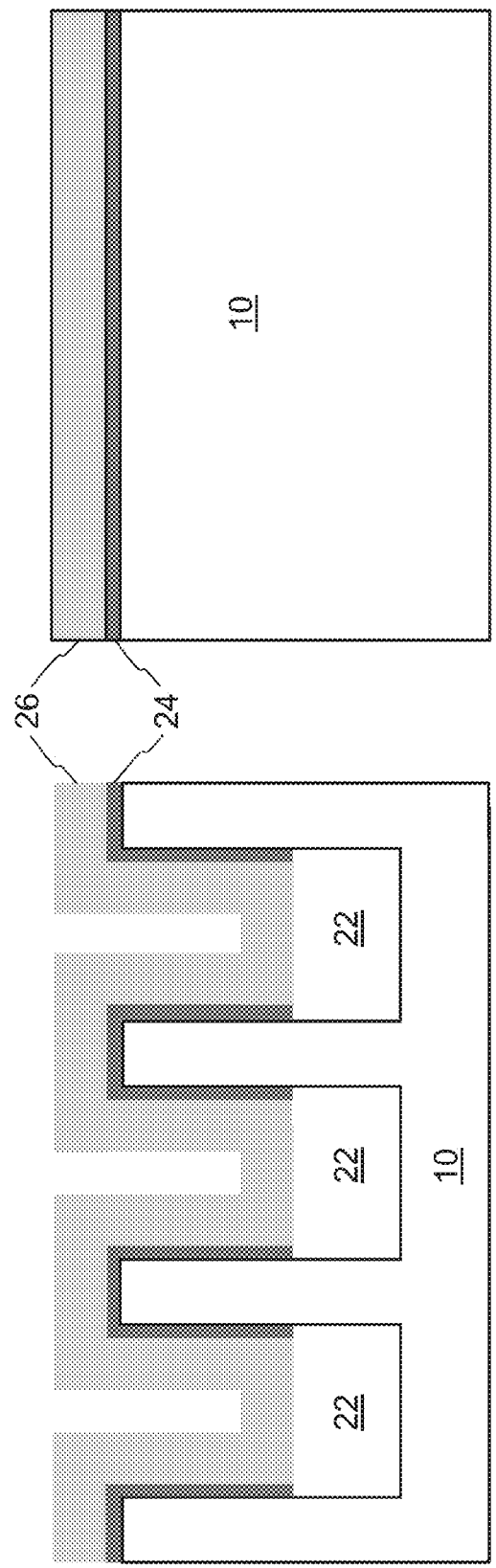

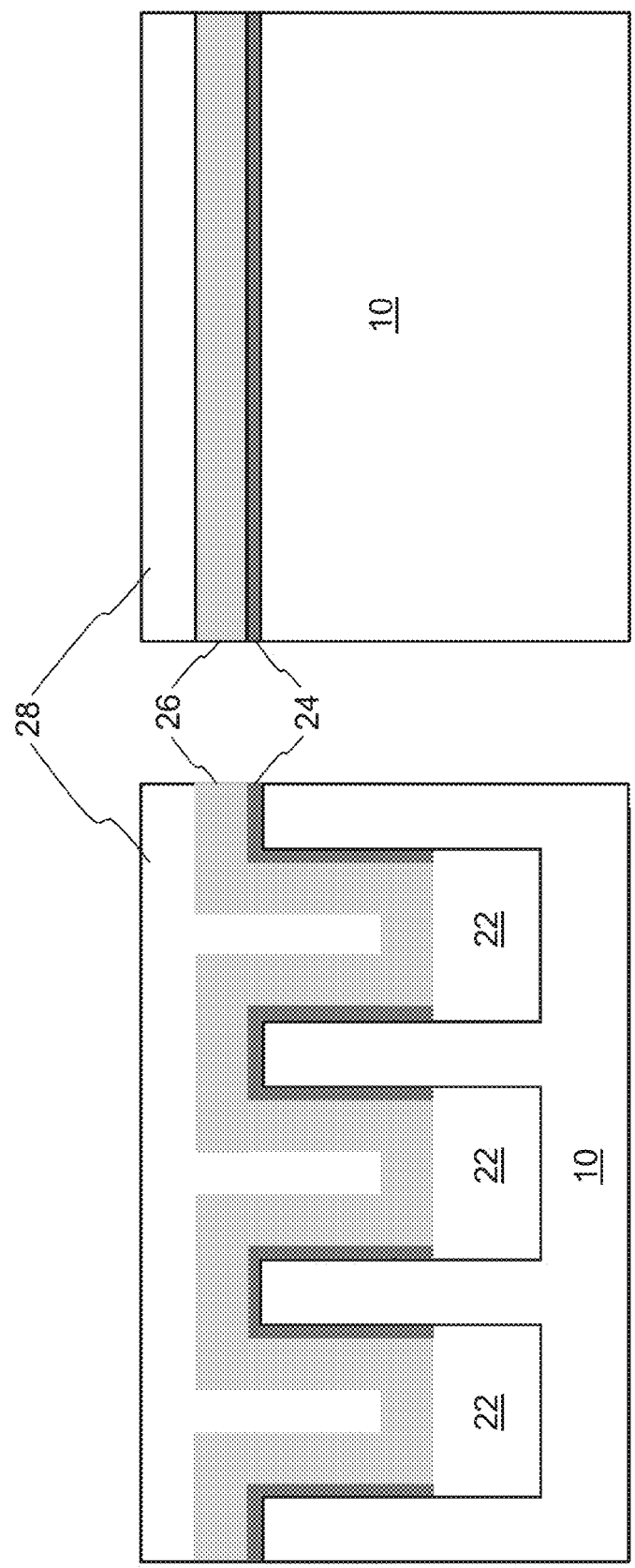

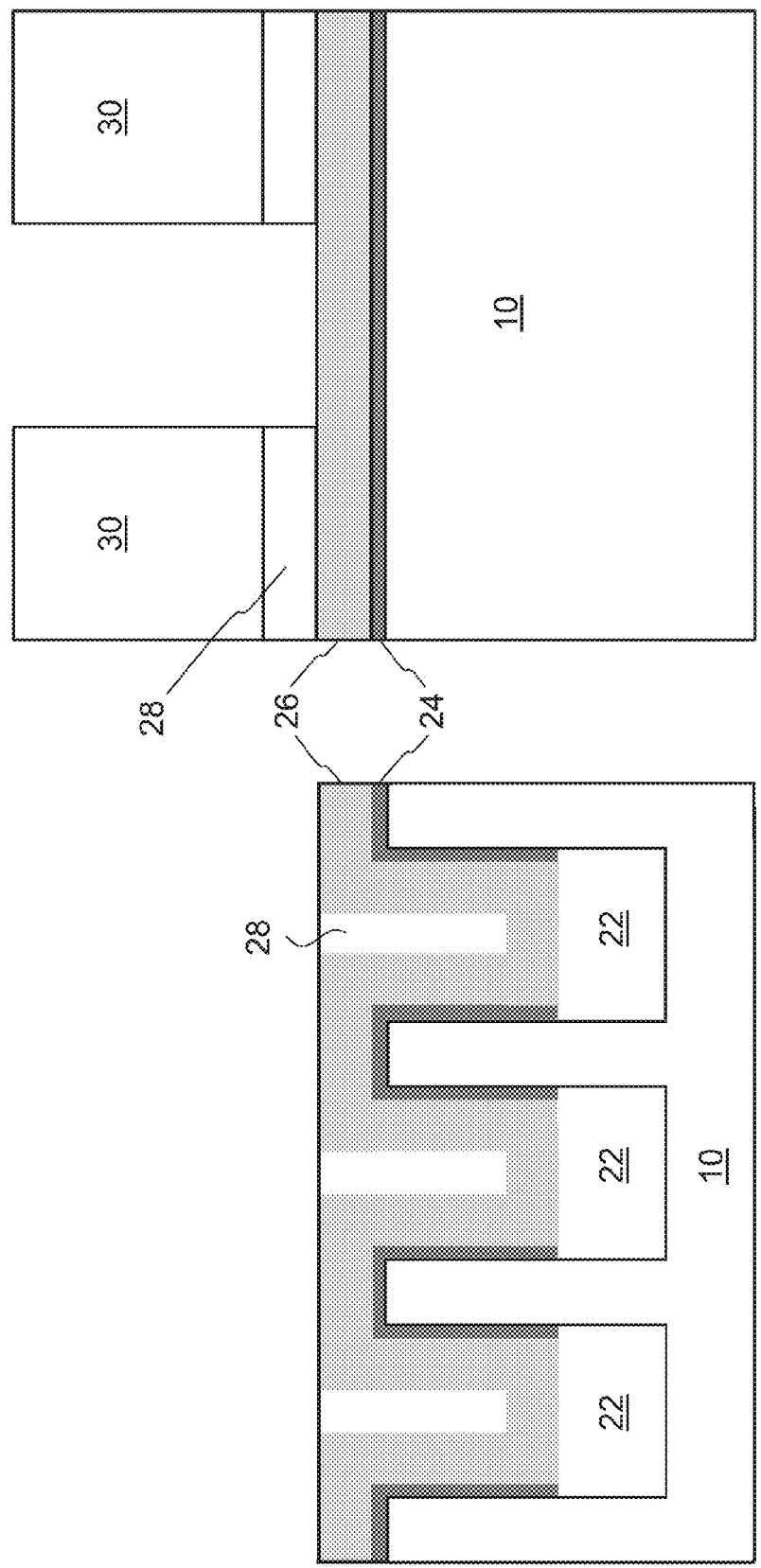

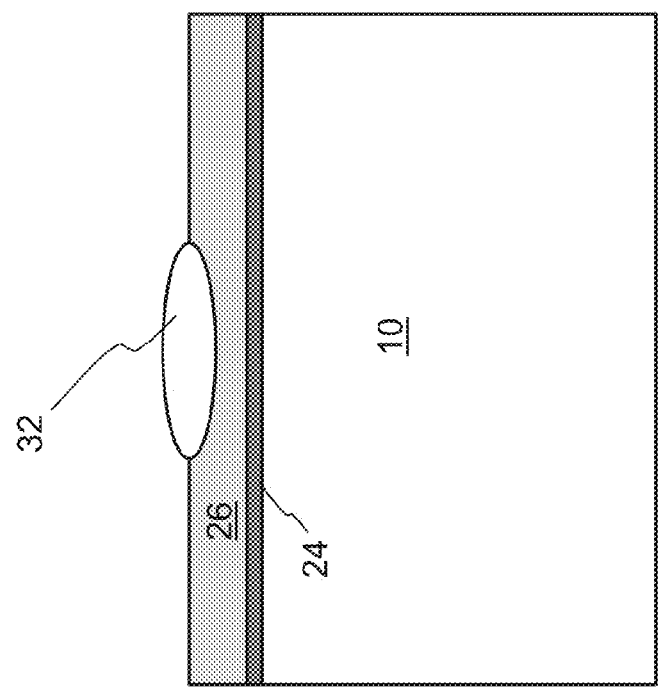
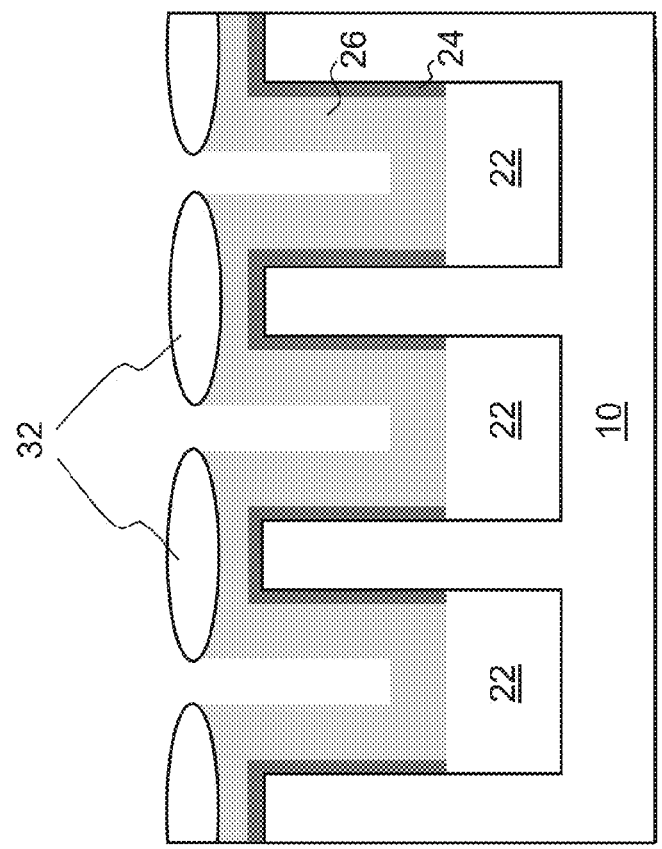

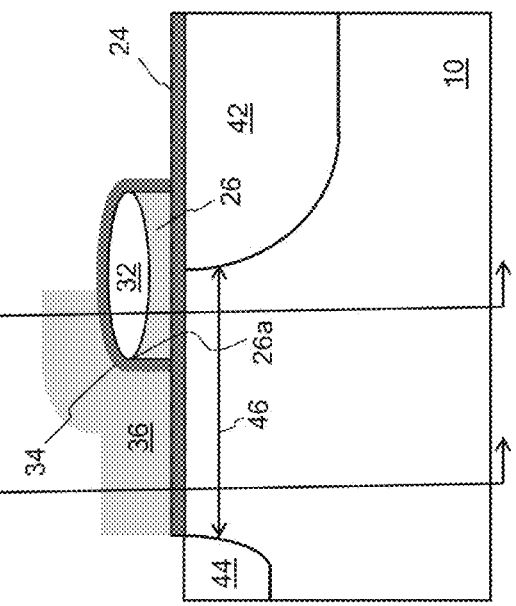
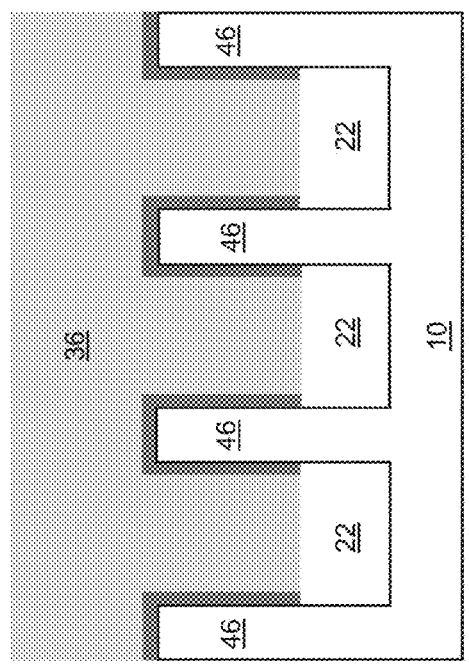
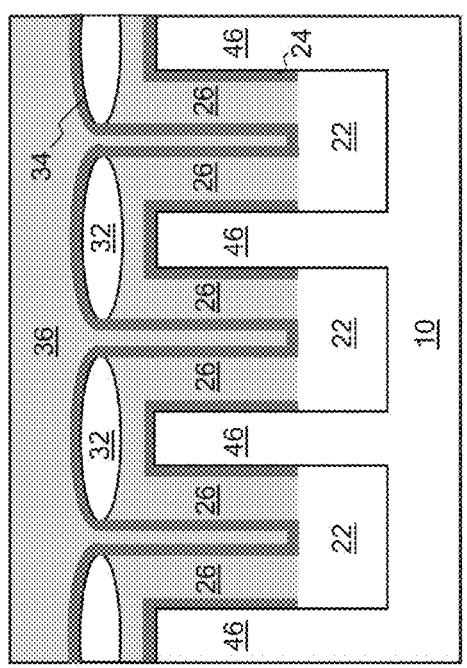

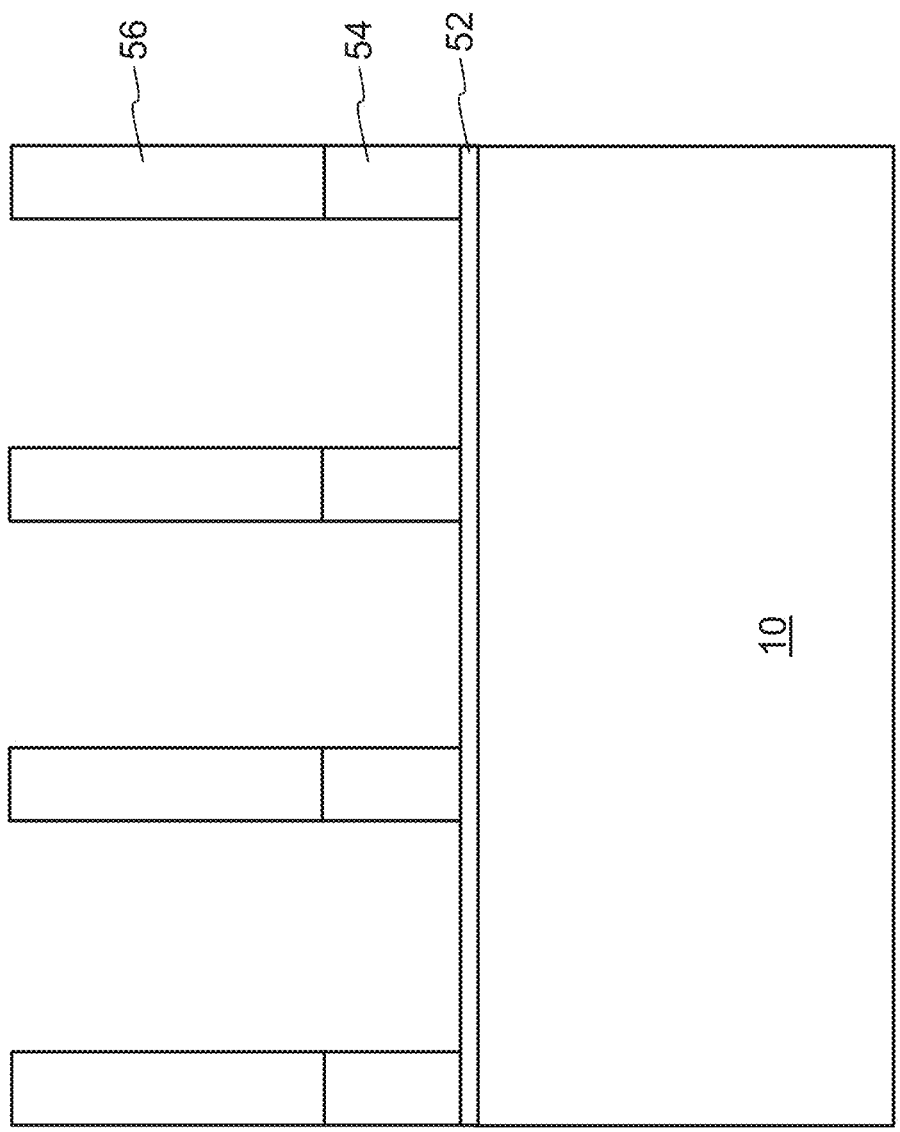

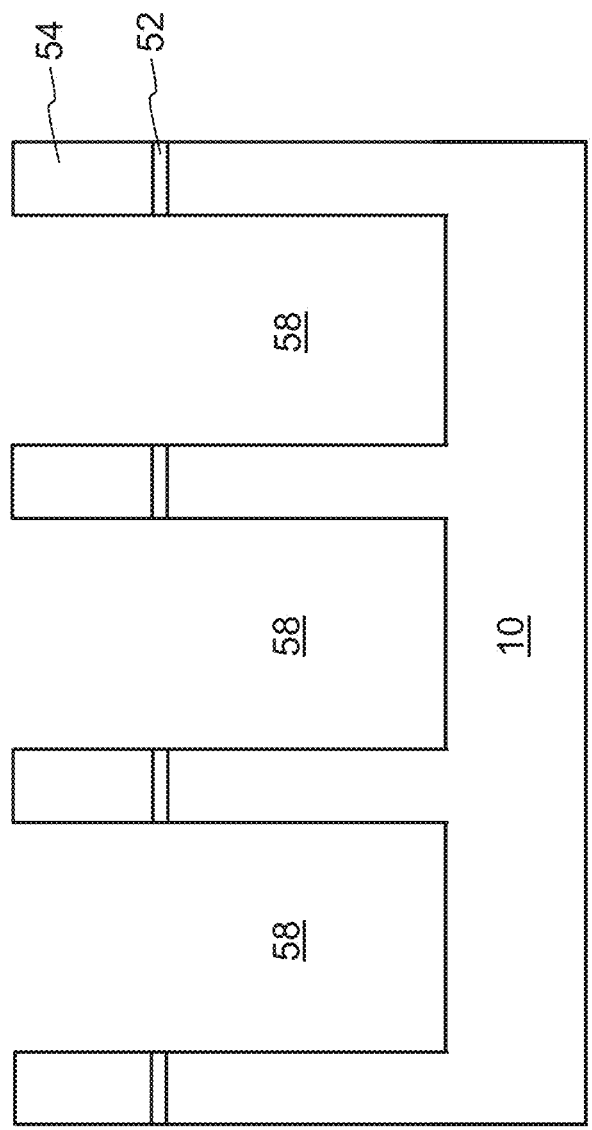

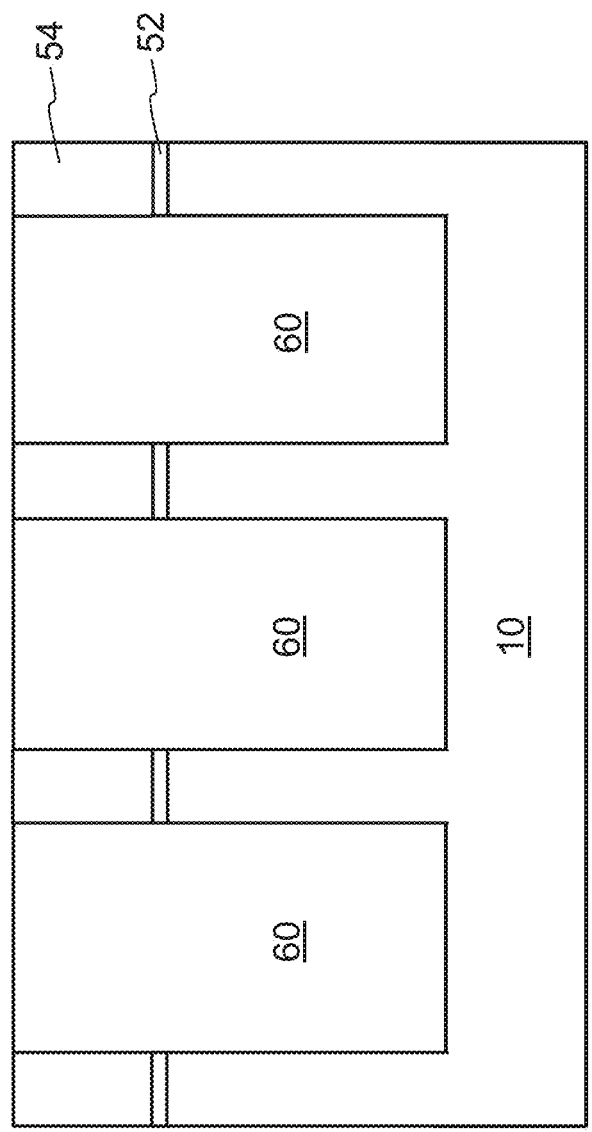

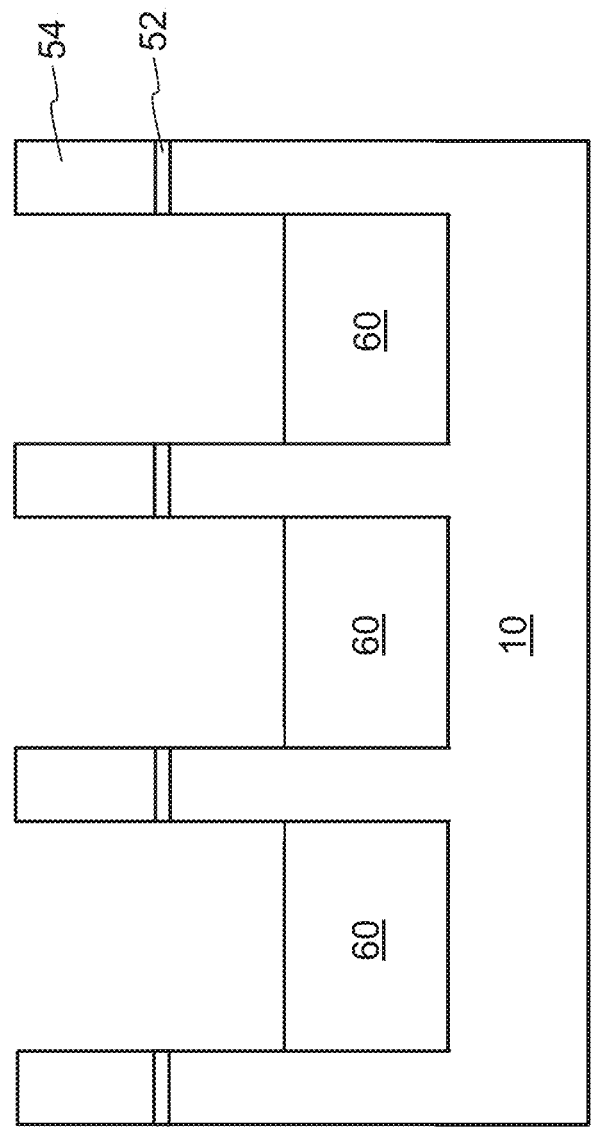

US 9,887,206 B2

METHOD OF MAKING SPLIT GATE NON-VOLATILE MEMORY CELL WITH 3D FINFET STRUCTURE

RELATED APPLICATIONS

This application is a divisional of U.S. application Ser. No. 15/050,309, filed on Feb. 22, 2016, which claims the benefit of U.S. Provisional Application No. 62/134,489, filed Mar. 17, 2015, which are incorporated herein by reference.

FIELD OF THE INVENTION

The present invention relates to non-volatile flash memory cell arrays.

BACKGROUND OF THE INVENTION

Currently, split-gate type non-volatile memory cells are known. U.S. Pat. No. 5,029,130 (incorporated by reference for all purposes) describes such a split gate memory cell. This memory cell has a floating gate disposed over and controlling the conduction of a first portion of the channel region, and a word line (control) gate disposed over and controlling the conduction of a second portion of the channel region. The control gate has a first portion disposed laterally adjacent the floating gate and disposed over the channel region second portion, and the control gate has a second portion that extends up and over the floating gate. Because the channel region is formed along the planar surface of the semiconductor substrate, as device geometries get smaller, so too does total area (e.g. width) of the channel region. This reduces the current flow between the source and drain regions, requiring more sensitive sense amplifiers etc. to detect the state of the memory cell.

Because the problem of shrinking the lithography size thereby reducing the channel width affects all semiconductor devices, a Fin-FET type of structure has been proposed. In a Fin-FET type of structure, a fin shaped member of semiconductor material connects the source to the drain regions. The fin shaped member has a top surface and two side surfaces. Current from the source to the drain regions can then flow along the top surface as well as the two side surfaces. Thus, the width of the channel region is increased, thereby increasing the current flow. However, the width of the channel region is increased without sacrificing more semiconductor real estate by "folding" the channel region into two side surfaces, thereby reducing the "footprint" of the channel region. Non-volatile memory cells using such Fin-FETs have been disclosed. Some examples of prior art Fin-FET non-volatile memory structures include U.S. Pat. Nos. 7,423,310, 7,410,913 and 8,461,640. However, heretofore, these prior art Fin-FET structures have disclosed using floating gate as a stack gate device, or using trapping material, or using SRO (silicon rich oxide) or using nanocrystal silicon to store charges, or other more complicated memory cell configurations.

BRIEF SUMMARY OF THE INVENTION

A method of forming a non-volatile memory cell includes forming a pair of parallel trenches into a surface of a semiconductor substrate of a first conductivity type resulting in a fin shaped upper surface portion between the trenches having a top surface and two side surfaces, forming insulation material along the top surface and the two side surfaces, forming spaced apart first and second regions of a second conductivity type different than the first conductivity type in the fin shaped upper surface portion with a channel region extending between the first region and the second region (wherein the channel region has a first portion that includes a first portion of the top surface and first portions of the two side surfaces, and has a second portion that includes a second portion of the top surface and second portions of the two side surfaces), forming a conductive floating gate, and forming a conductive control gate. The conductive floating gate includes a first portion that extends along and is insulated from the first portion of the top surface, a second portion that extends along and is insulated from the first portion of one of the two side surfaces, and a third portion that extends along and is insulated from the first portion of the other of the two side surfaces. The conductive control gate that includes a first portion that extends along and is insulated from the second portion of the top surface, a second portion that extends along and is insulated from the second portion of one of the two side surfaces, a third portion that extends along and is insulated from the second portion of the other of the two side surfaces, a fourth portion that extends up and over and is insulated from at least some of the floating gate first portion, a fifth portion that extends out and over and is insulated from at least some of the floating gate second portion, and a sixth portion that extends out and over and is insulated from at least some of the floating gate third portion.

Other objects and features of the present invention will become apparent by a review of the specification, claims and appended figures.

BRIEF DESCRIPTION OF THE DRAWINGS

FIGS. 5A-5H are side cross sectional views (along the WL (X) direction) showing the steps in forming the split-gate non-volatile memory cell of the present invention according to an alternate embodiment.

DETAILED DESCRIPTION OF THE INVENTION

The present invention is a Fin-FET configuration for the simple split gate type memory cell that has only two gates, a floating gate and a control gate, where the control gate has a first portion laterally adjacent to the floating gate and a second portion that extends up and over the floating gate. The method of making such a split gate memory cell provide many advantages, including silicon trench etching and partial oxide fill for isolation, and self-aligned components such as the floating gate.

Figure 1A:
FIGS. 1A-1X are side cross sectional views (along the WL (X) direction) showing the steps in forming the split-gate non-volatile memory cell of the present invention.
Figure 2A:
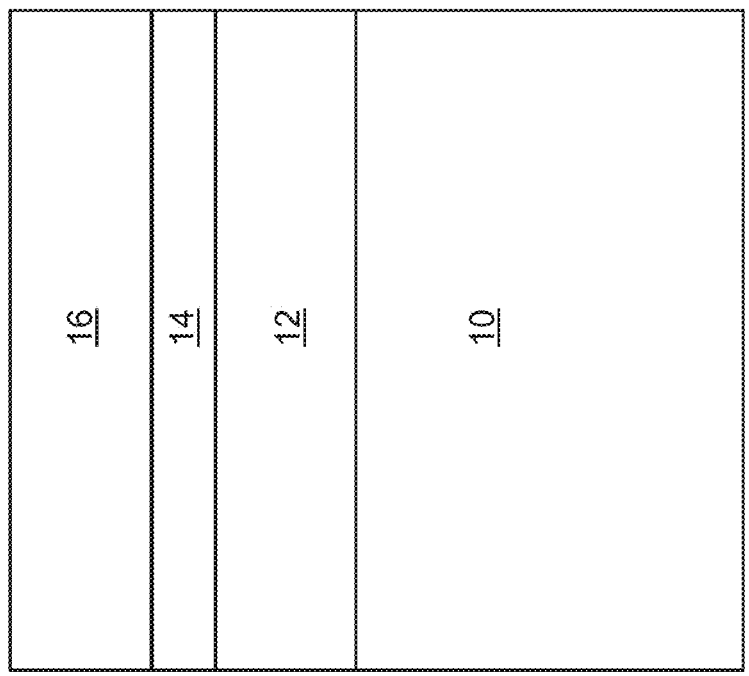
FIGS. 2A-2W are side cross sectional views (along the BL (Y) direction) showing the steps in forming the split-gate non-volatile memory cell of the present invention.
Figure 2B:
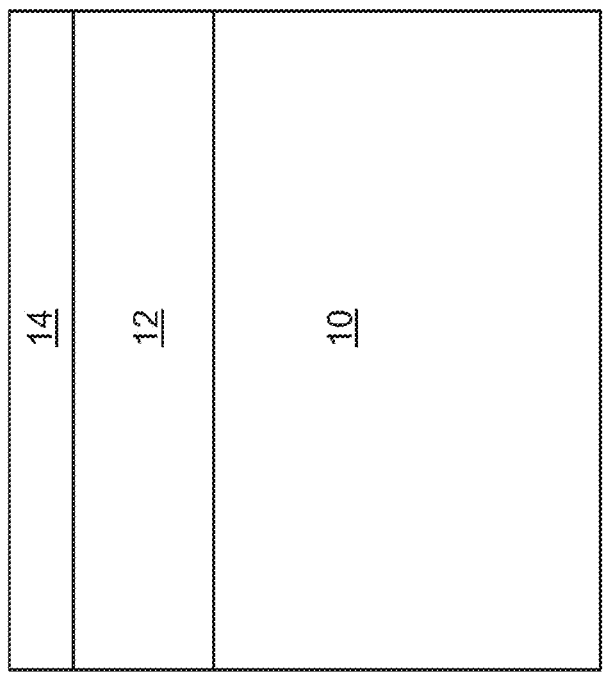
Figure 1B:
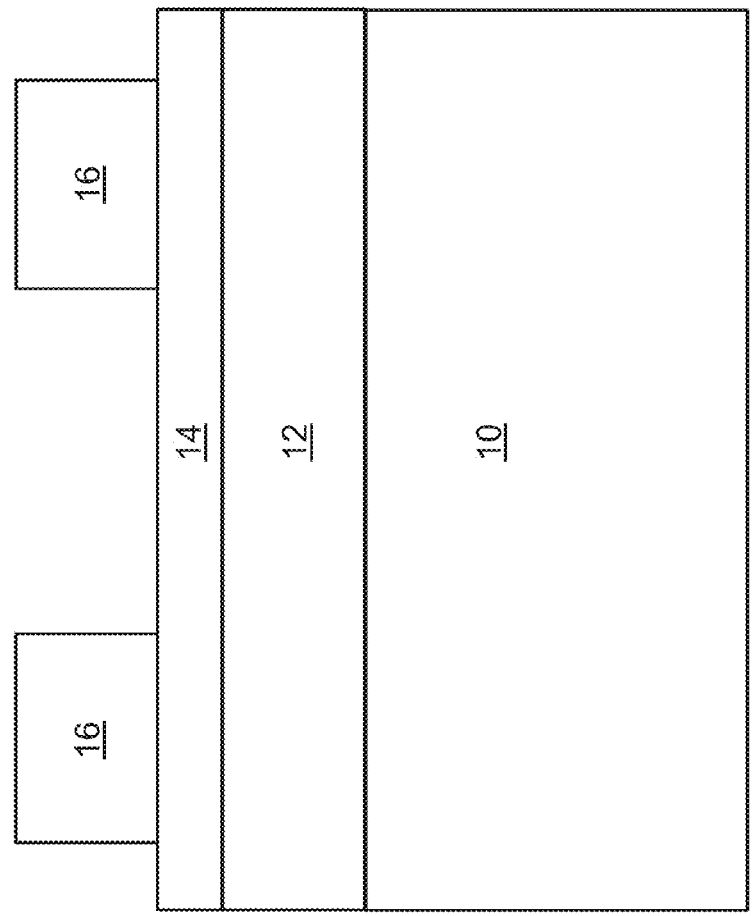

FIGS. 1A-1Y and 2A-2X are side cross sectional views showing the process steps in forming the Fin-FET split gate memory cell array. FIGS. 1A-1X show the cross section in the word line (X) direction, and FIGS. 2A-2X show the cross section in the bit line (Y) direction. The process begins by forming a layer of silicon nitride ("nitride") 12 on the surface of a silicon substrate 10. A layer polysilicon ("poly") 14 is formed on the nitride layer 12. A second nitride layer 16 is formed on the poly layer 14. The resulting structure is shown in FIGS. 1A and 2A. The second nitride layer 16 is patterned using a photo lithography and etch process (i.e. photo resist is deposited, selectively exposed and etched, leaving portions of the nitride layer 16 exposed, which are then etched using a nitride etch). The nitride etch removes all but a pair of blocks of the nitride 16, as shown in FIGS. 1B and 2B.

Figure 2C:
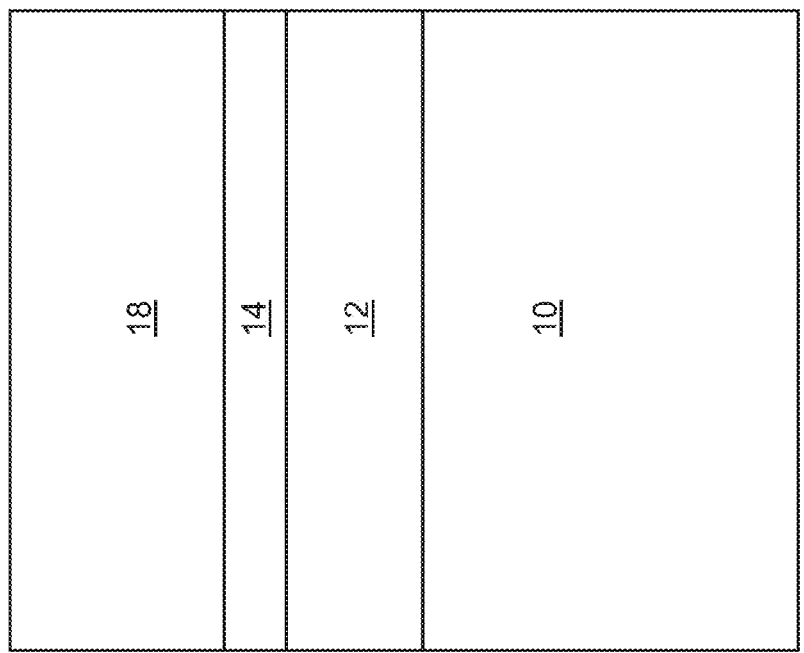
Figure 1C:
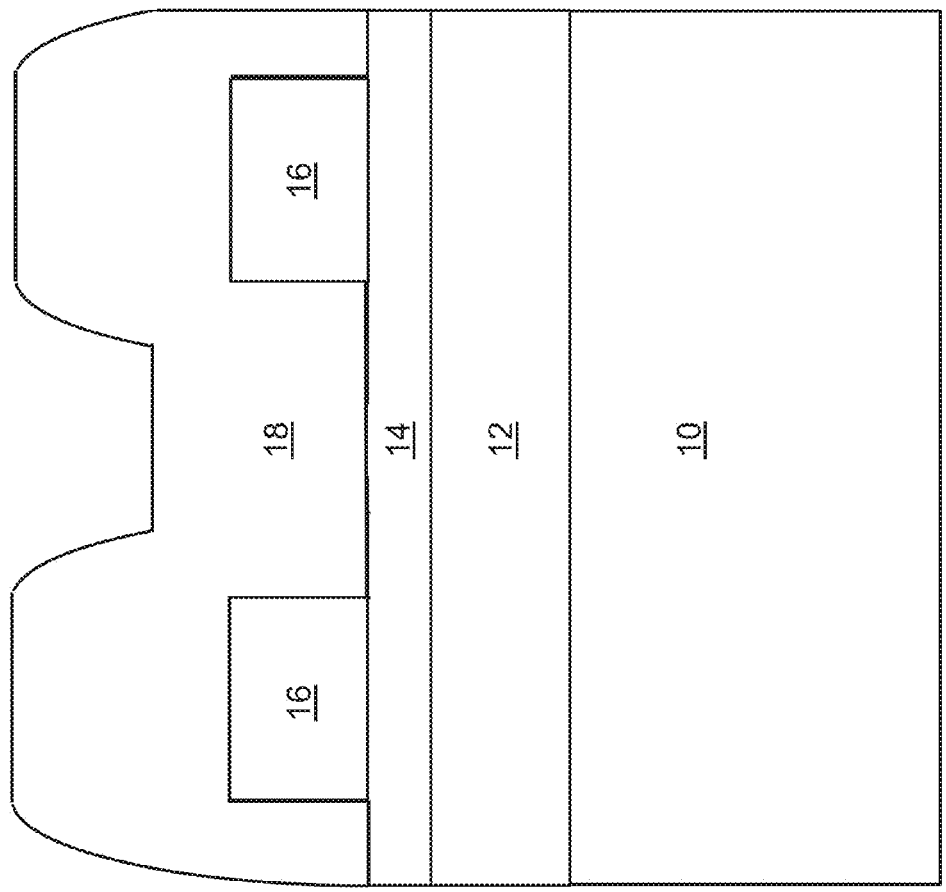
Figure 2D:
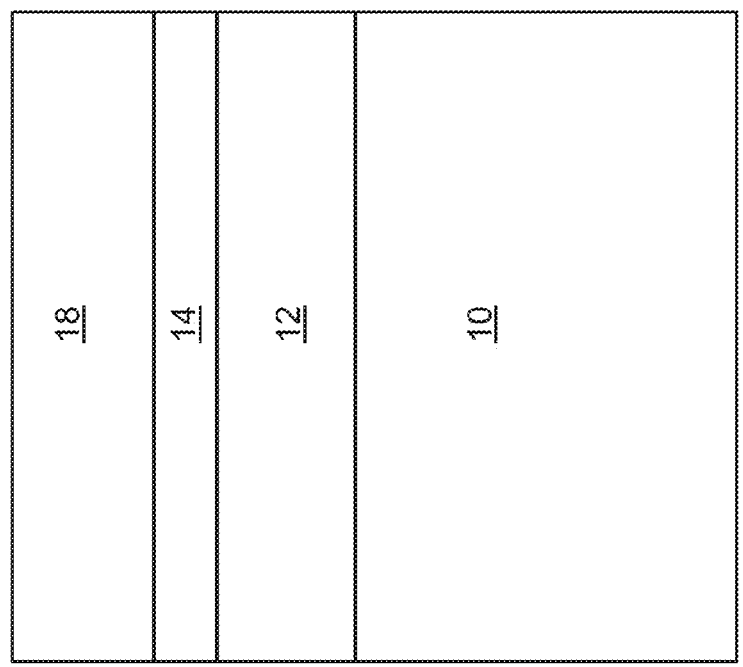
Figure 1D:
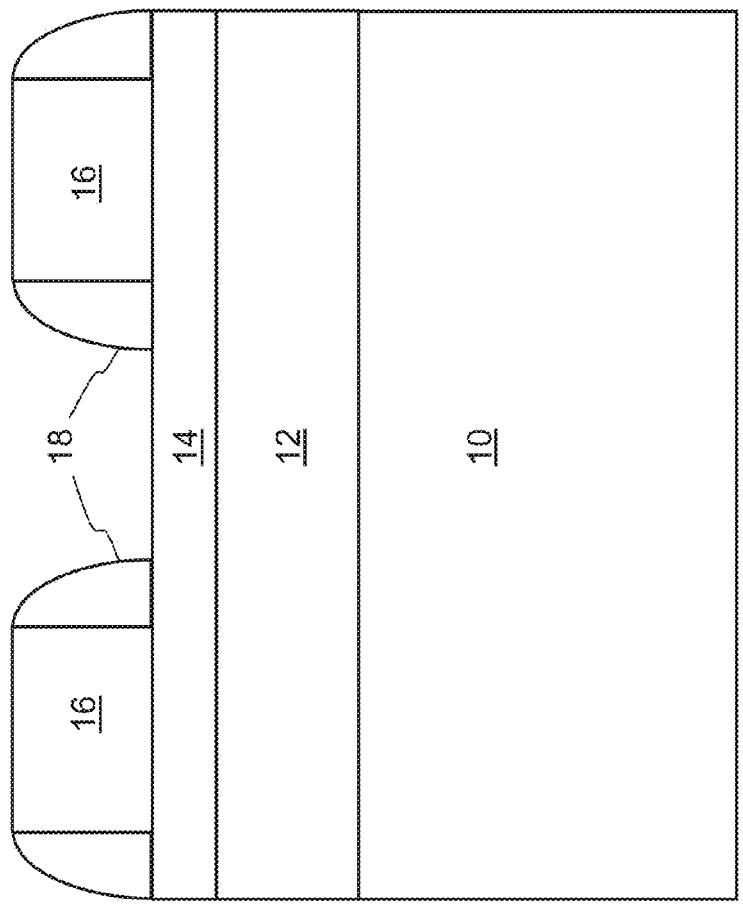
Figure 2E:
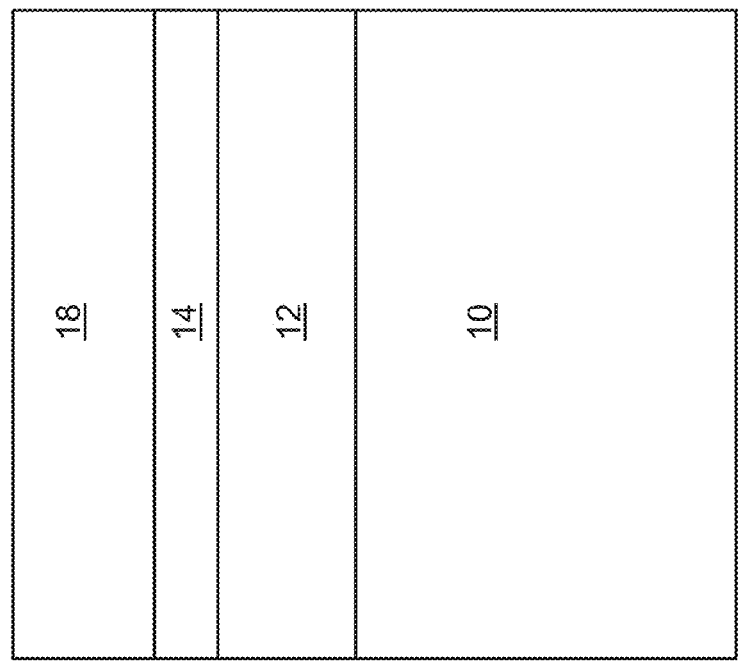
Figure 1E:
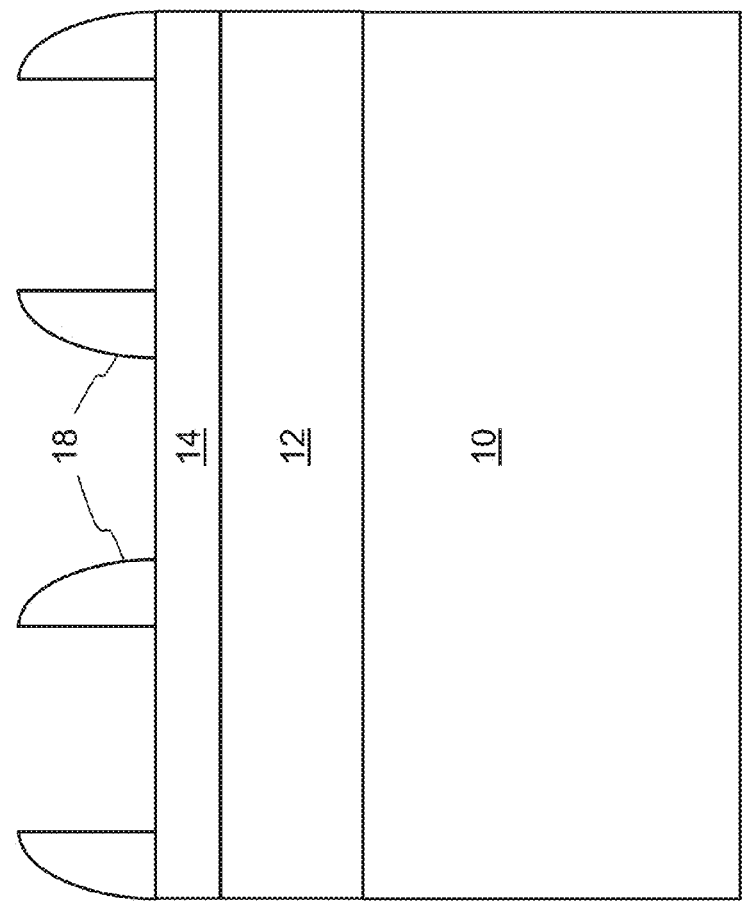
Figure 2F:
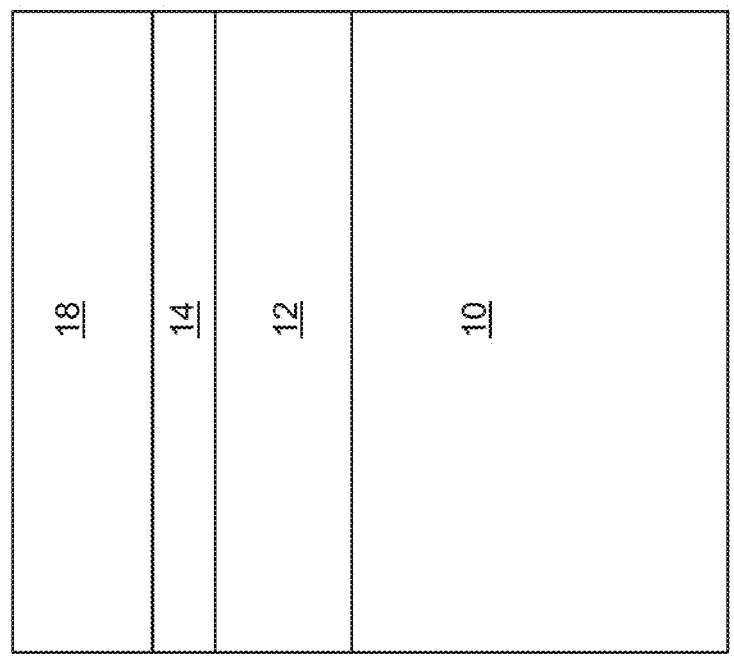
Figure 1F:
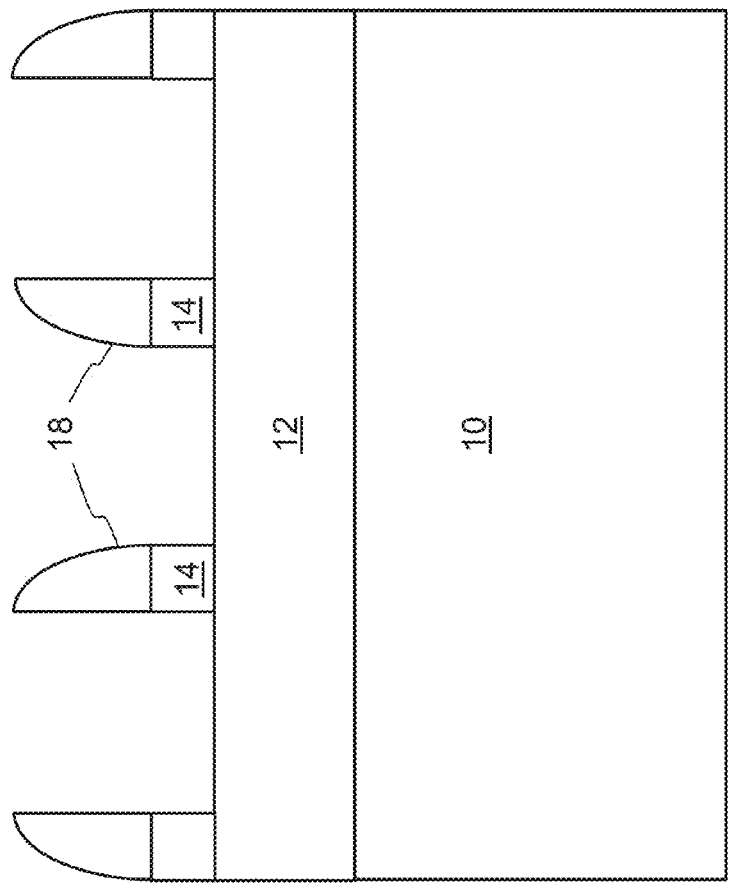
Figure 2H:
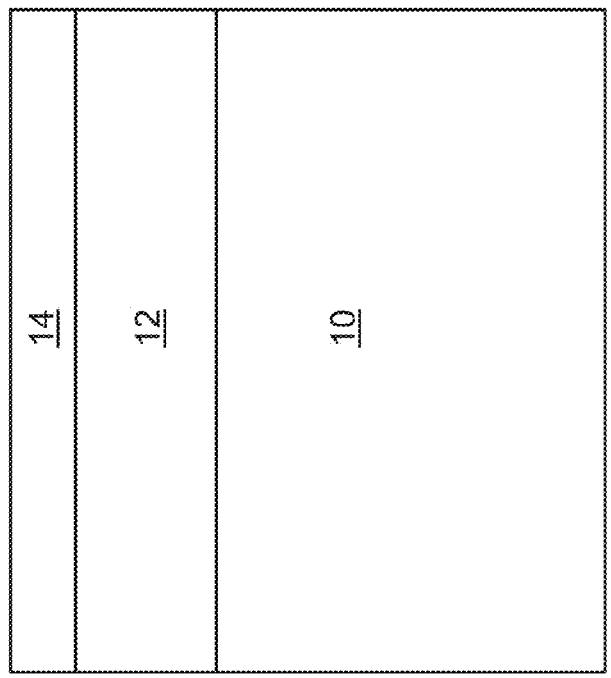
Figure 1H:
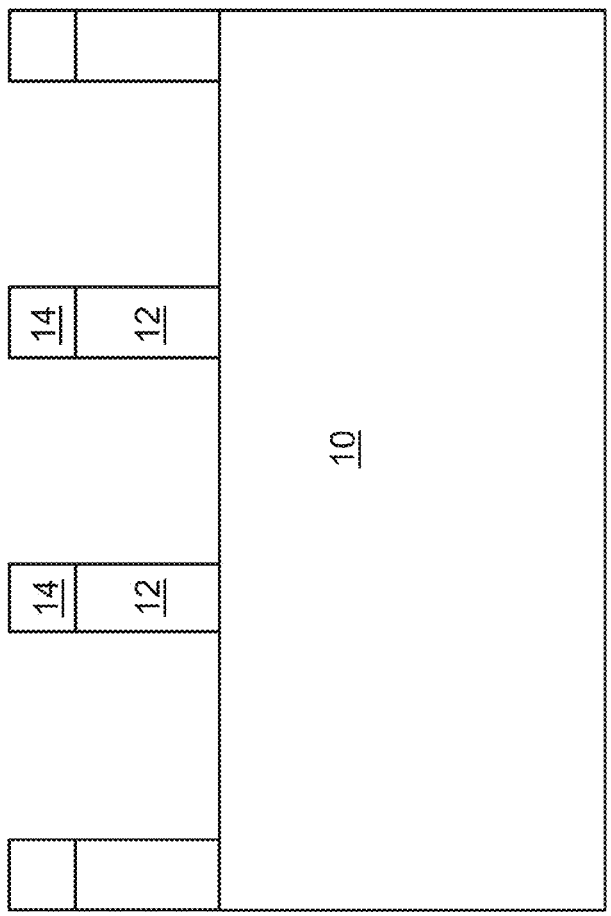
Figure 2I:
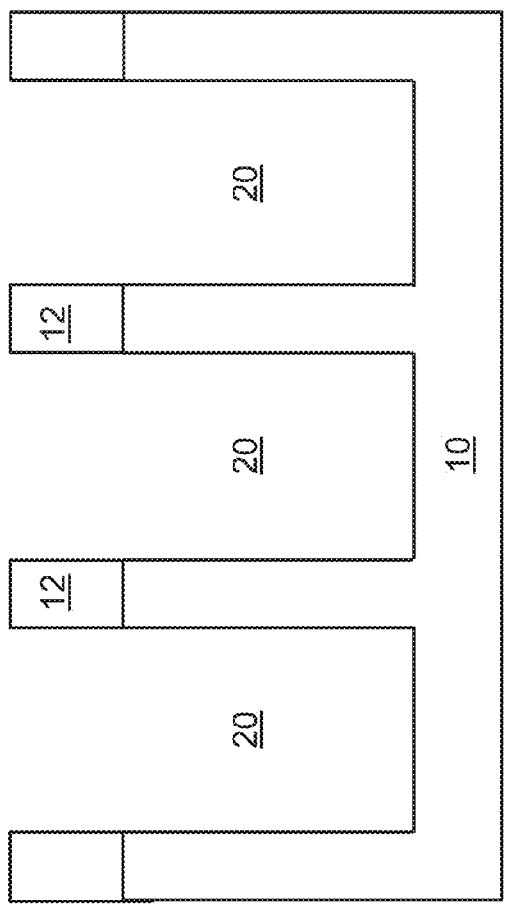
Figure 1I:
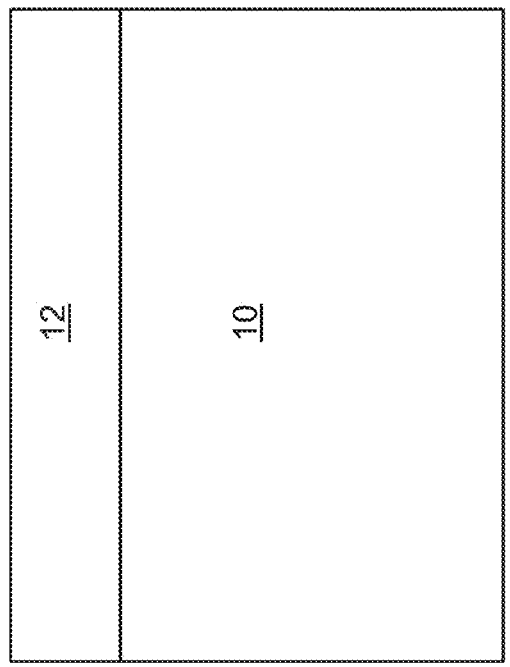
Figure 2J:
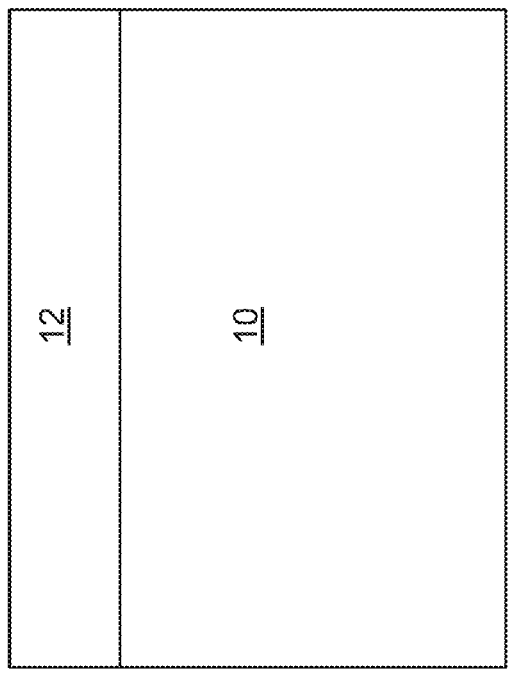
Figure 1J:
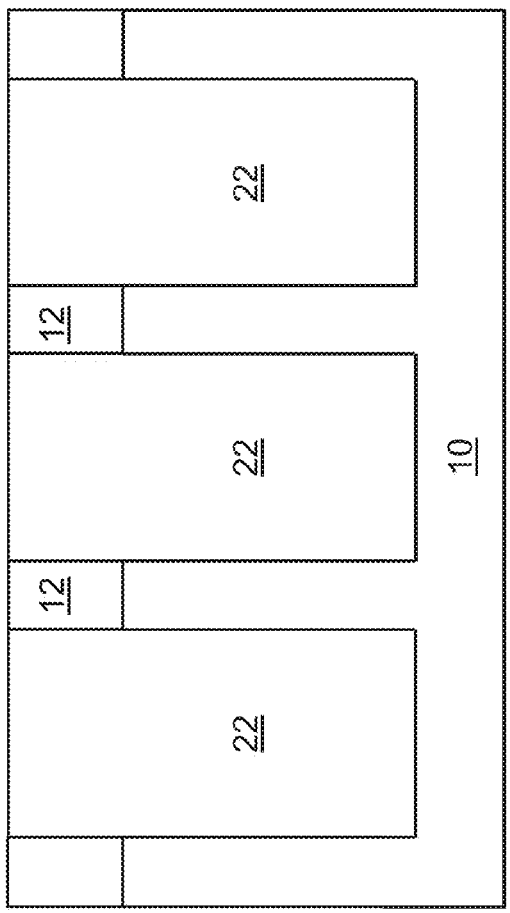
Figure 2K:
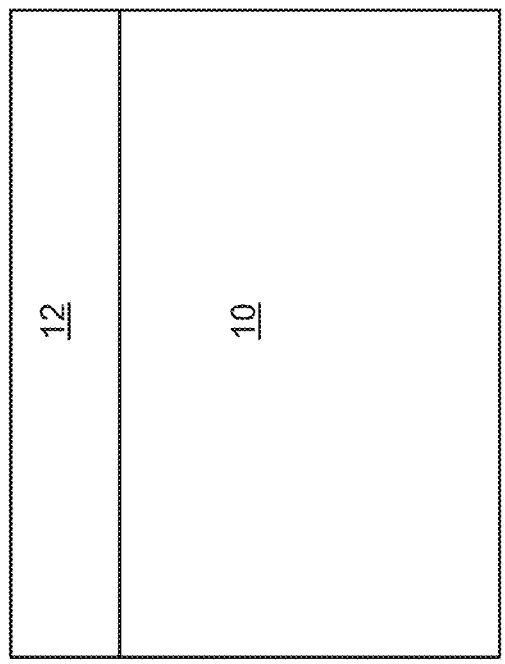
Figure 1K:
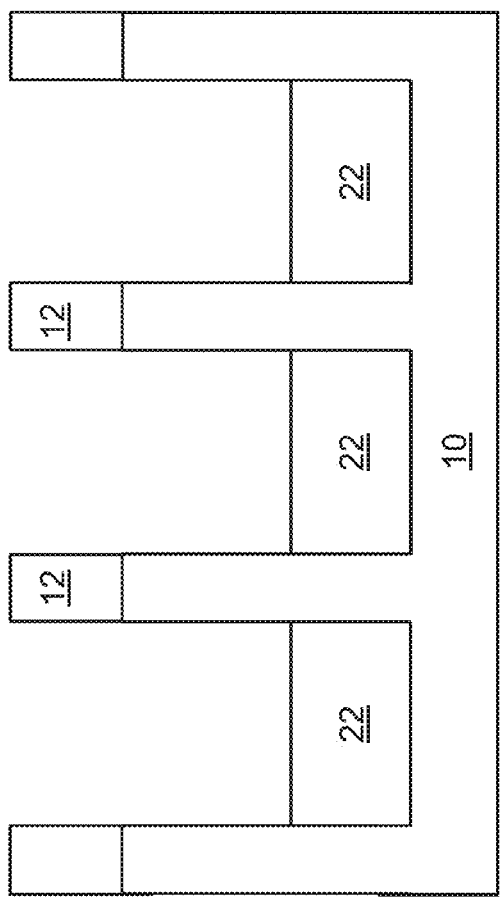
Figure 2L:
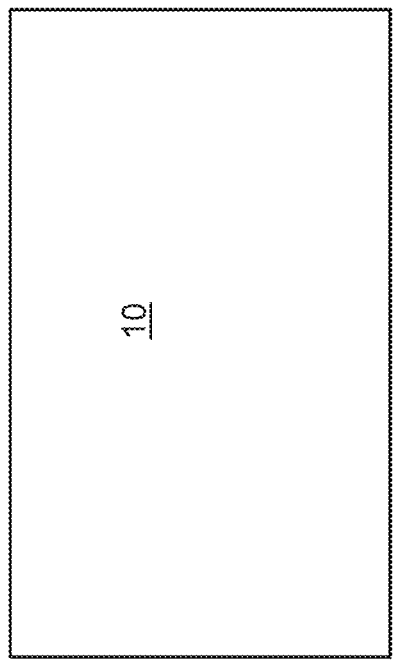
Figure 1L:
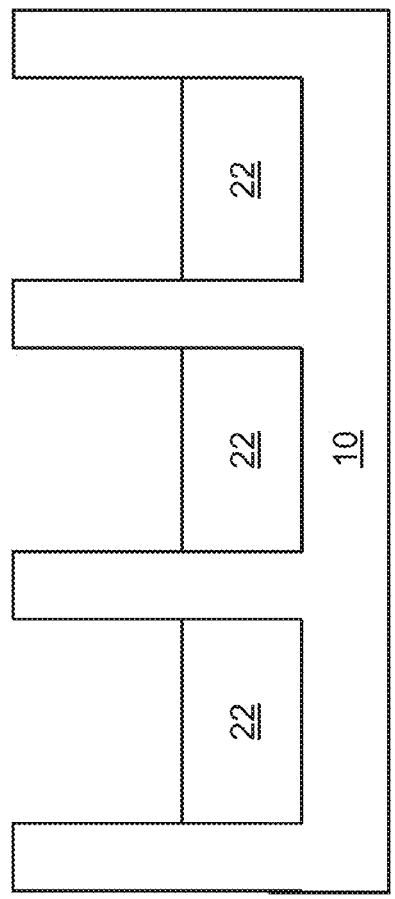
Figure 2P:
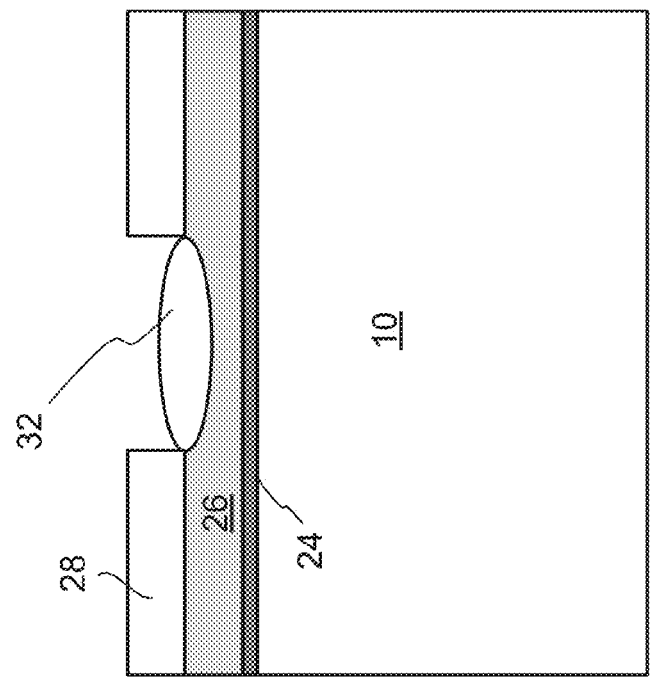

A layer of silicon dioxide ("oxide") 18 is formed over the structure, as shown in FIGS. 1C and 2C. An anisotropic oxide etch is performed to lower the oxide in the BL direction, and leave spacers of the oxide 18 abutting the nitride blocks (FIGS. 1D/2D). The nitride blocks 16 are then removed with a nitride etch (FIGS. 1E/2E). A poly etch is then performed, to remove the exposed portions of the poly layer 14 in the WL direction (except for the poly layer blocks 14 under the oxide spacers (FIGS. 1F/2F). The oxide layer and spacers 18 are then removed with an oxide etch (FIGS. 1G/2G). A nitride etch is used to remove the nitride layer 12 in the WL direction (except for blocks of the nitride layer 12 under the poly blocks 14) (FIGS. 1H/2H). A silicon etch is then performed which removes the remaining portions of the poly layer 14, and also forms trenches 20 into the exposed portions of the silicon substrate 10 in the WL direction (FIGS. 1I/2I). Oxide 22 is then deposited over the structure, followed by a chemical mechanical polish (CMP) using the nitride layer 12 as an etch stop, which fills the trenches with oxide 22 (FIGS. 1J/2J). A partial oxide etch is then performed to recess the oxide 22 in the trenches (FIGS. 1K/2K). A nitride etch is then used to remove the nitride 12 (FIGS. 1L/2L).

Figure 1P:
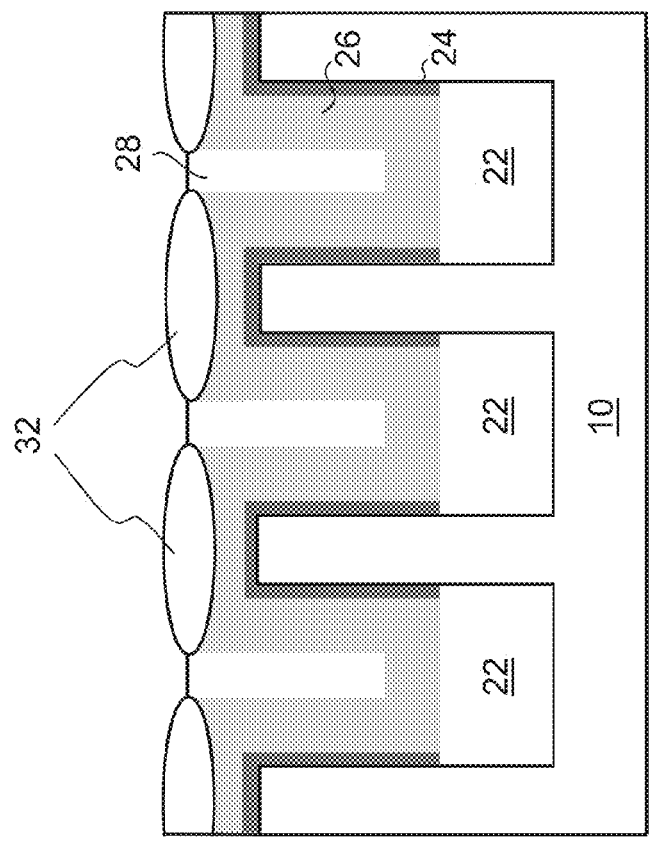
Figure 2R:
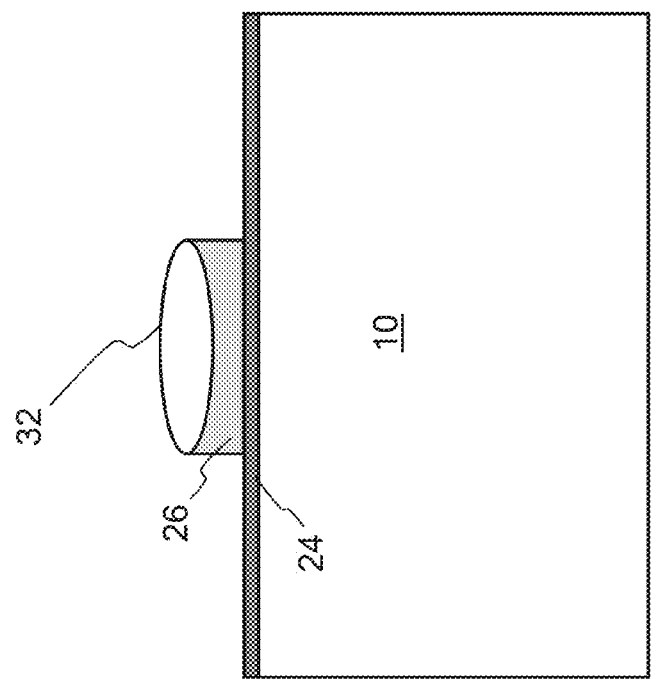
Figure 1R:
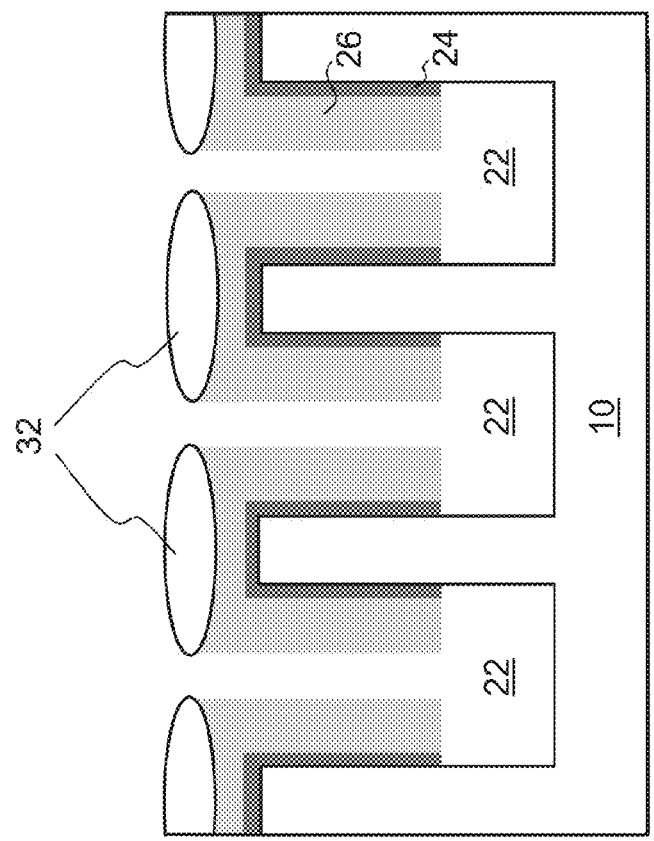
Figure 2S:
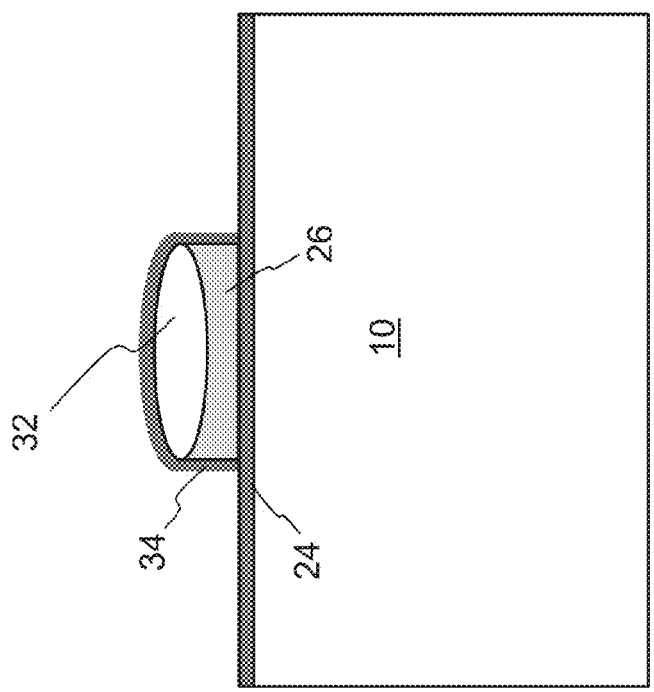

An thin oxide layer 24 (FG OX) is then deposited or grown on the exposed surfaces of the substrate 10, including those in the trenches 20. A poly layer 26 (FG Poly) is then formed over the oxide layer 24 (FIGS. 1M/2M). A nitride layer 28 is then deposited on the poly layer (filling trenches 20, and then planarized using a planarizing etch (FIGS. 1N/2N). Photo resist 30 is then deposited on the structure, and selectively etched using a photolithography process, leaving strips of the photo resist 30 (FGPR) extending in the WL direction (leaving portions of the nitride layer 28 exposed). The exposed portions of the nitride layer 28 are removed by a nitride etch (FIG. 1O/2O). The photo resist 30 is then removed. An oxidation process is used to oxidize the exposed portions of the poly layer 26, creating regions of oxidized polysilicon 32 (Poly Ox) (FIGS. 1P/2P). The nitride 28 is then removed using a wet nitride etch (FIGS. 1Q/2Q). An anisotropic poly etch is performed to remove those portions of the poly layer 26 not underneath the oxidized poly 32 (FIGS. 1R/2R).

Figure 1S:
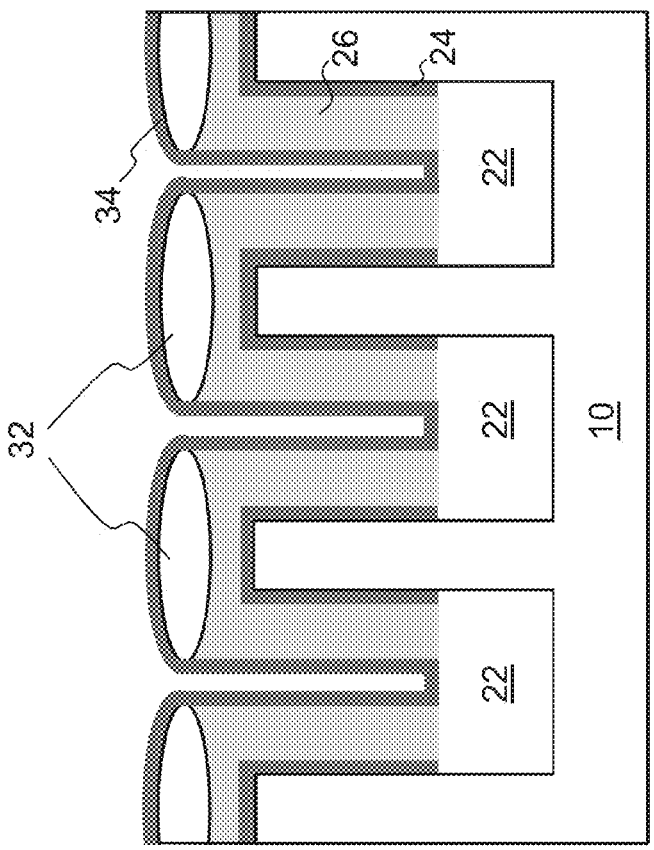
Figure 2T:
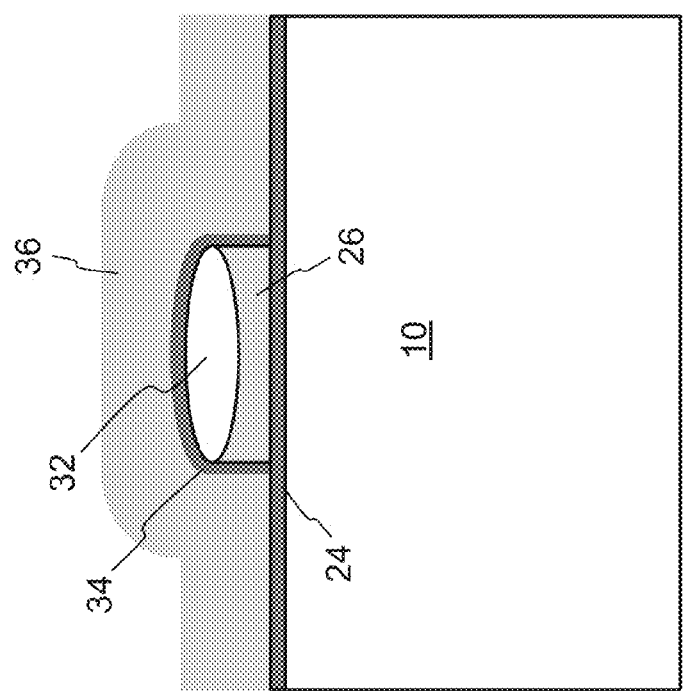
Figure 1T:
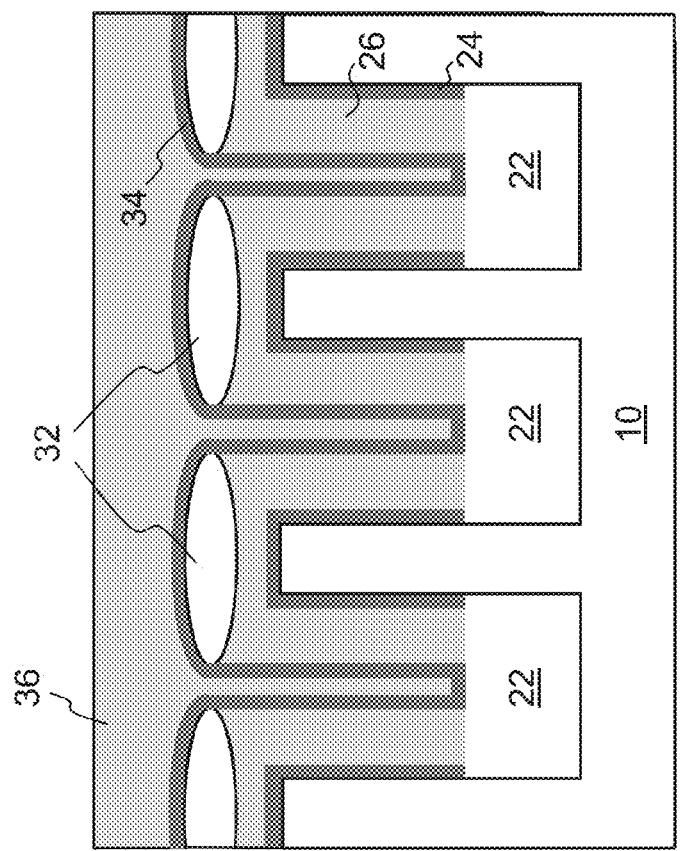
Figure 2U:
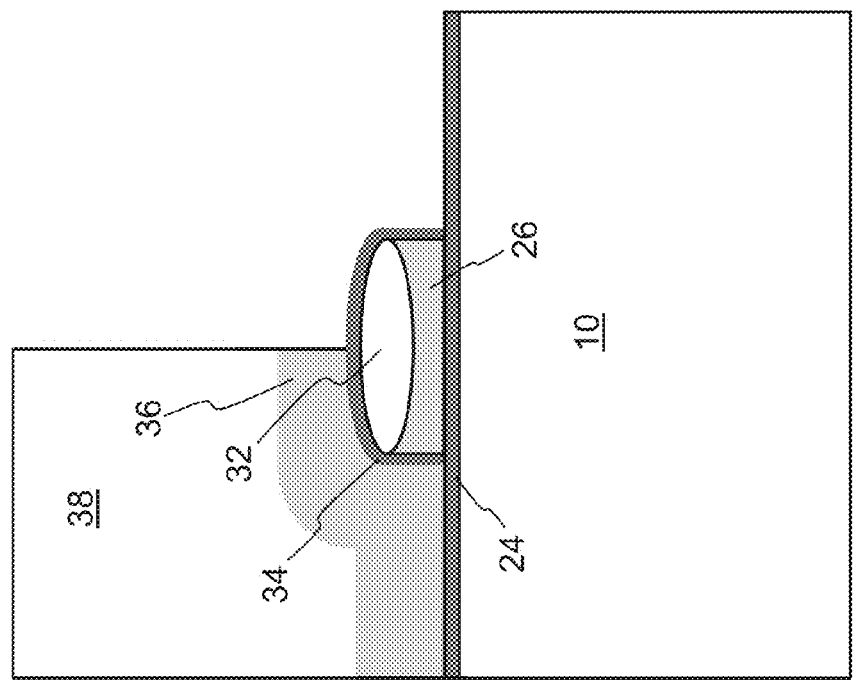
Figure 1U:
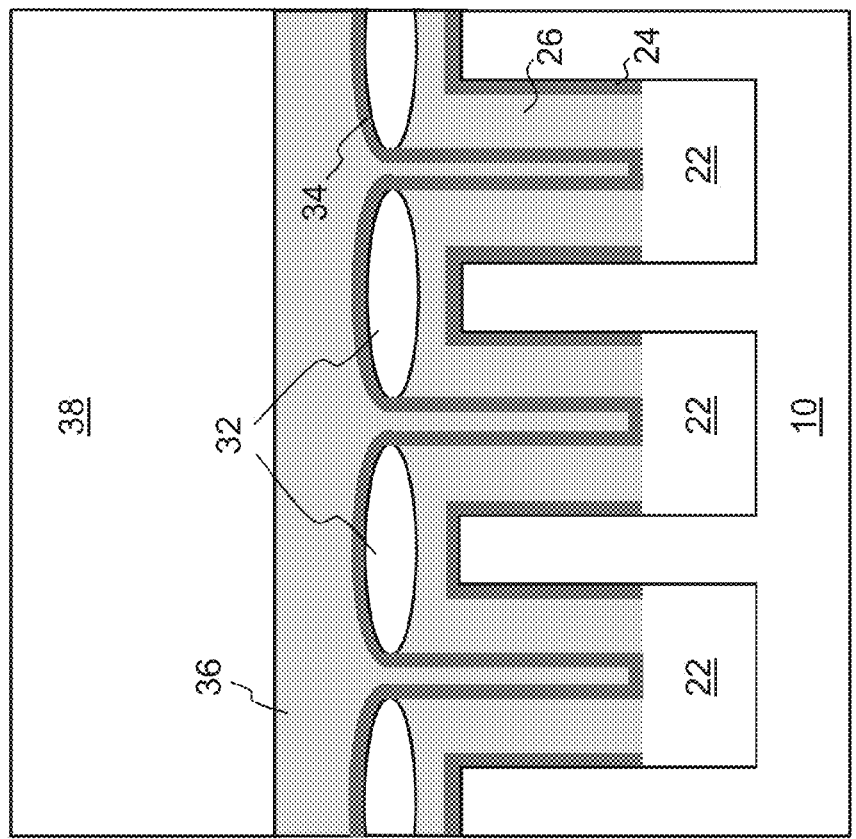
Figure 2V:
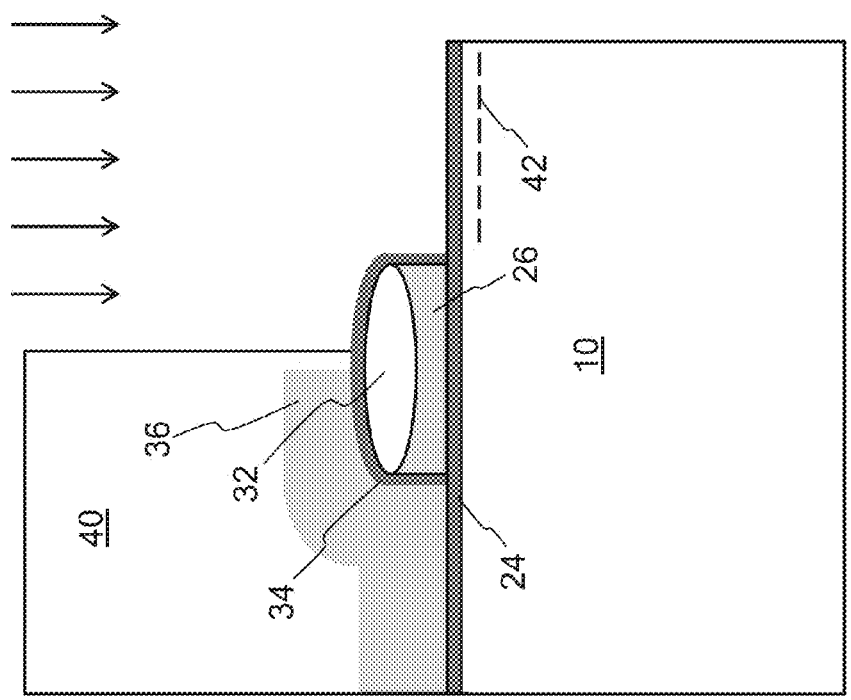
Figure 1V:
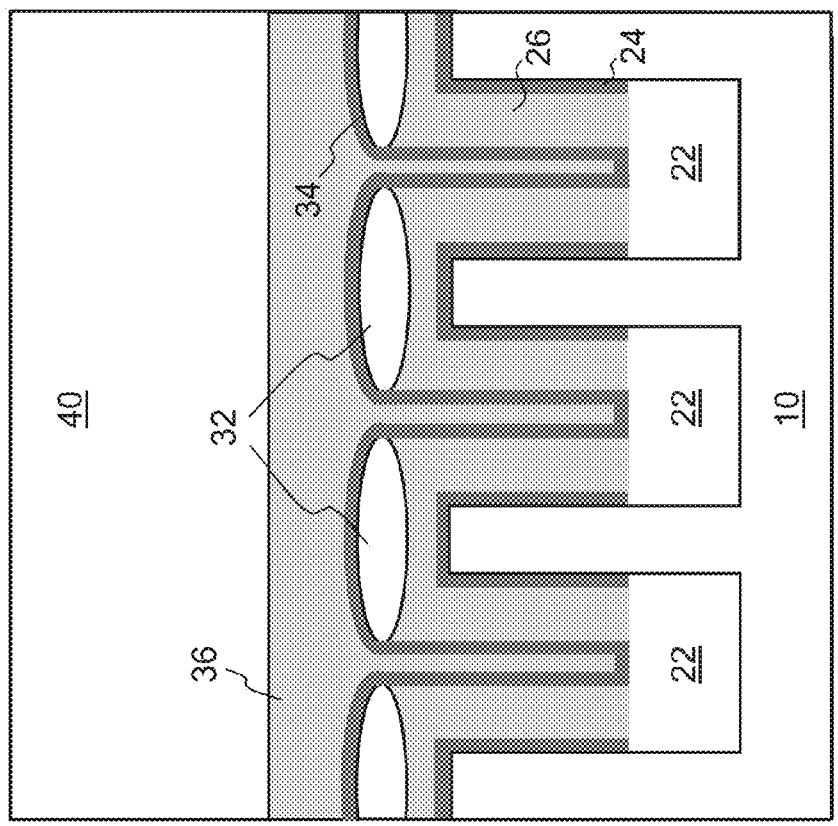

A word line VT implant (e.g. blanket boron implant) is performed into the surface portions of the substrate 10 adjacent the poly layer 26 and oxidized poly 32 (to control the word line Vt). An oxide layer 34 (Tunnel Ox) is formed (e.g. by HTO deposition) on the oxidized poly 32 and the exposed portions of the poly layer 26 (FIGS. 1S/2S). A poly layer 36 is then formed over the structure (FIGS. 1T/2T). An implantation process is then performed (e.g. N+ implantation) for doping of the poly layer 36. Photoresist 38 is then deposited over the structure and portions thereof selectively removed by a photolithography etch process, leaving portions of the poly layer 36 exposed by the photo resist 38 in the BL direction. A poly etch is then performed to remove the exposed portions of the poly layer 36 (FIG. 1U/2U). The photoresist 38 is removed, and new photoresist 40 is deposited over the structure and portions thereof selectively removed by a photolithography etch process, leaving portions of the structure exposed by the photo resist 40 in the BL direction. A high voltage implant (HVII implant) is performed to form the source line junction 42 in the surface of the substrate adjacent the FG Poly 26 (FIGS. 1V/2V). An anneal is performed to complete the formation of the source region (SL) 42 in the substrate. A similar implant/anneal can be performed to form the drain region (DR) 44 in the substrate on the other side of the poly layer 36. The final structure is shown in FIGS. 1W, 1X and 2W. Additional processing is then performed to form electrical contacts, contact lines, source diffusion lines, etc. which are well known in the art.

The above described process forms memory cells having a floating gate 26 disposed over the top, and along the sides, of a first portion of the fin shaped channel region 46 of the substrate that extends between the source region 42 and drain region 44 (see FIGS. 1W and 2W). The second poly layer 36 is a control gate that has a first portion disposed over the top, and along the sides, of a second portion of the fin shaped channel region 46 of the substrate (see FIGS. 1X and 2W), and a second portion that extends up and over the floating gate 26 and down along the sides of the floating gate 26 (see FIGS. 1W and 2W). The oxide 24 and 34 in the silicon trenches provides isolation from the silicon fins and between adjacent memory cells. This cell configuration provides a split gate memory cell that combines (1) a control gate 36 having a first portion adjacent the floating gate 26 and a second portion that extends up and over the floating gate 26, (2) a floating gate 26 that extends along the top surface and the side surfaces of a first portion of the fin shaped channel region 46 for enhanced capacitive coupling there between, (3) the first portion of the control gate 36 extends along the top surface and the side surfaces of a second portion of the fin shaped channel region 46, which enhances capacitive coupling there between and maximizes current flow with smaller scaled device components (i.e. more device components within the same unit area of the substrate surface), (4) the second portion of the control gate 36 extends up and over the top portion of the floating gate, and extends out and over side portions of the floating gate, for enhanced capacitive coupling there between, and (5) the upper surface of the floating gate is sloping up to a sharpened edge 26a (relative to the floating gate sidewall) that faces the control gate 36 for enhanced tunneling there between. This configuration also allows for efficient formation processing with self-aligned memory cell components.

Figure 3:
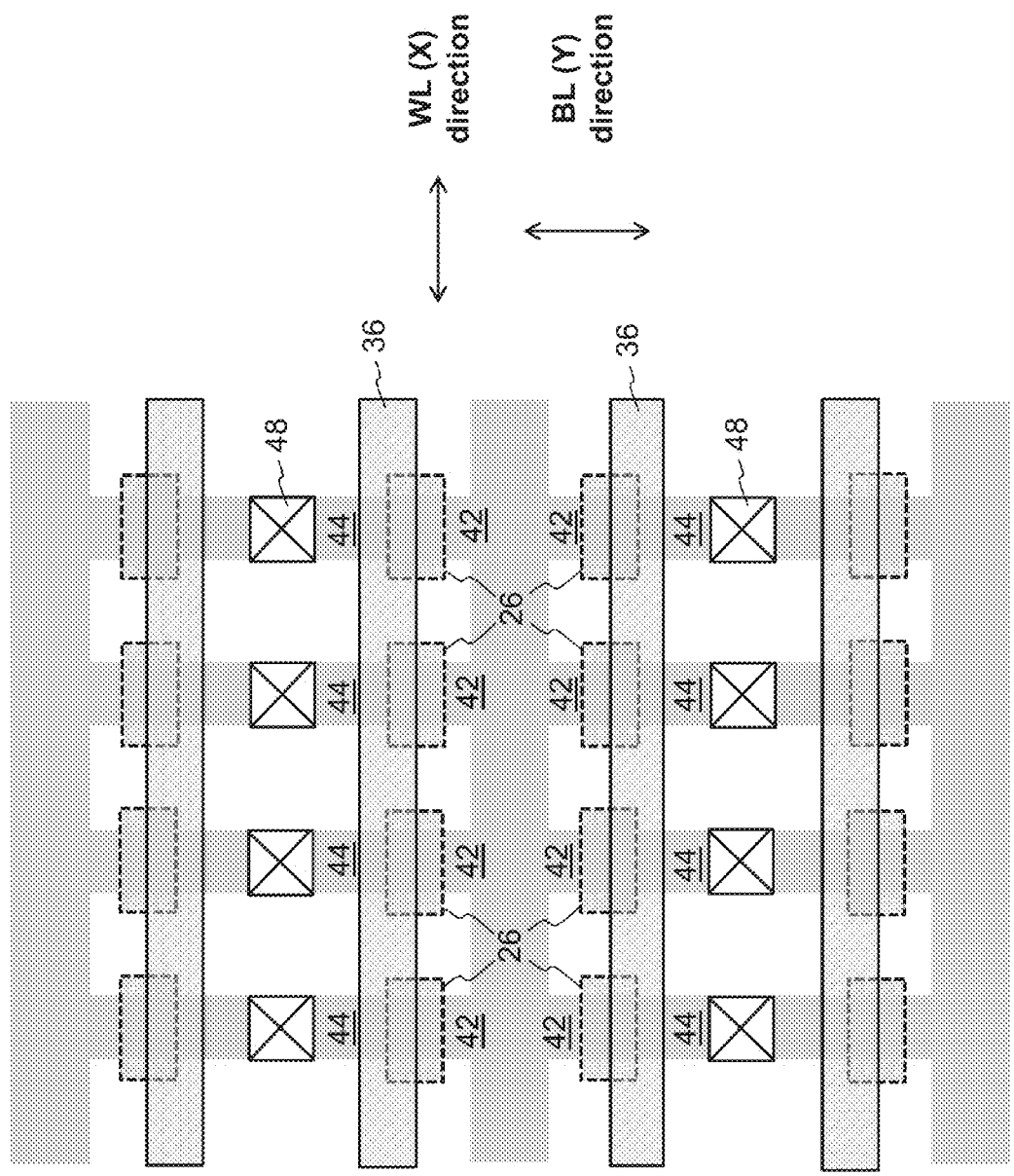
FIG. 3 is a top view of the memory cell array layout.

FIG. 3 shows a top view of the memory cell array layout. Diffusing lines in the substrate connect rows of the source regions 42 together. The floating gates 26 are all self-aligned in the X direction by the photo resist 30 of FIG. 2O and in the Y direction by the oxide spacers 18 of FIG. 1F. Bit line contacts 48 are connected to the drain regions 44, and are connected together in the Y direction by metal lines (not shown).

Figure 4:
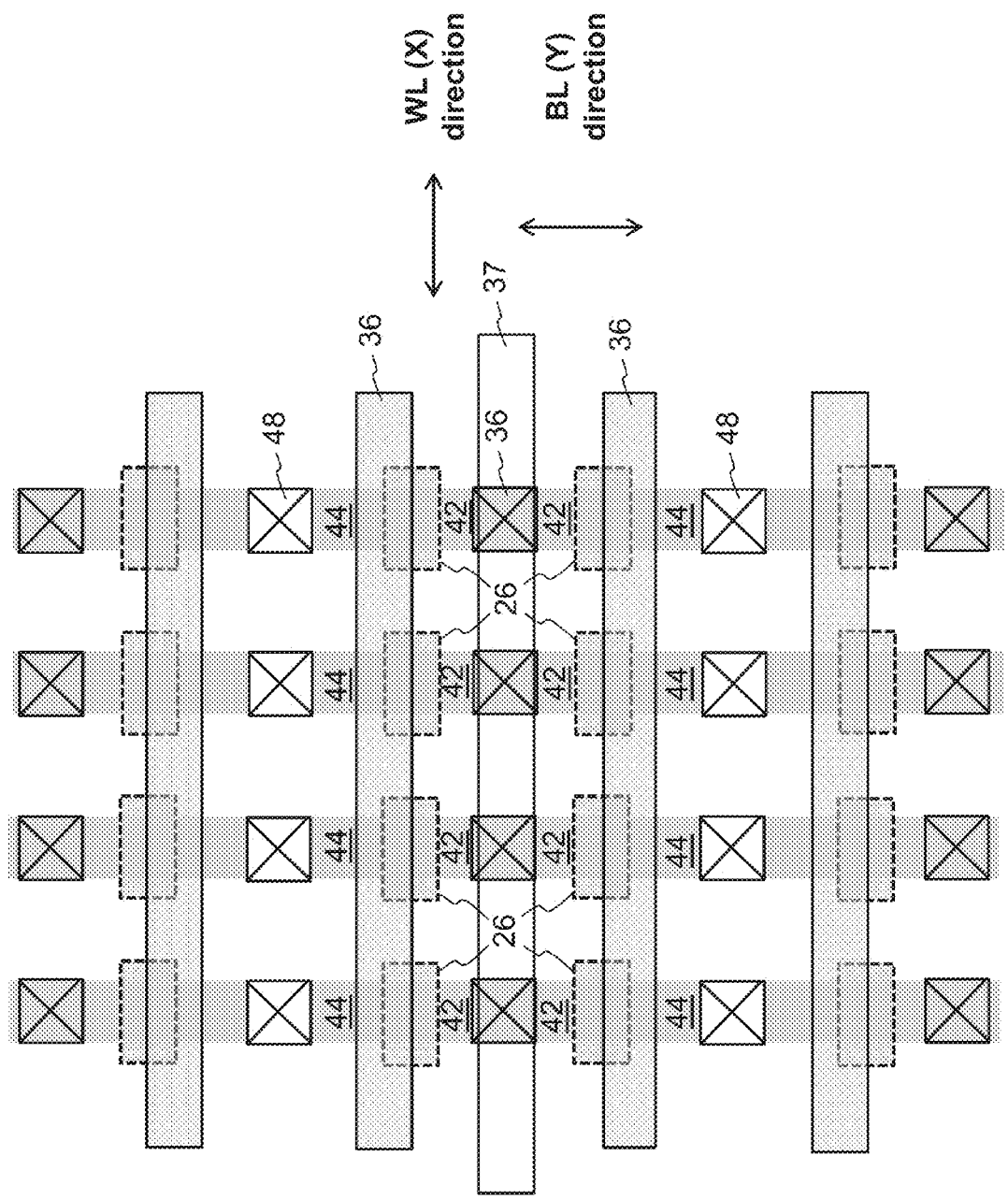
FIG. 4 is a top view of the memory cell array layout in an alternate embodiment.

FIG. 4 shows a top view of an alternate embodiment of the memory cell array layout, where rows of the source regions are connected together by source line contacts 36 and metal source lines 37 connecting those contacts together extending in the X direction, instead of lines of diffusion in the substrate.

Figure 5A:
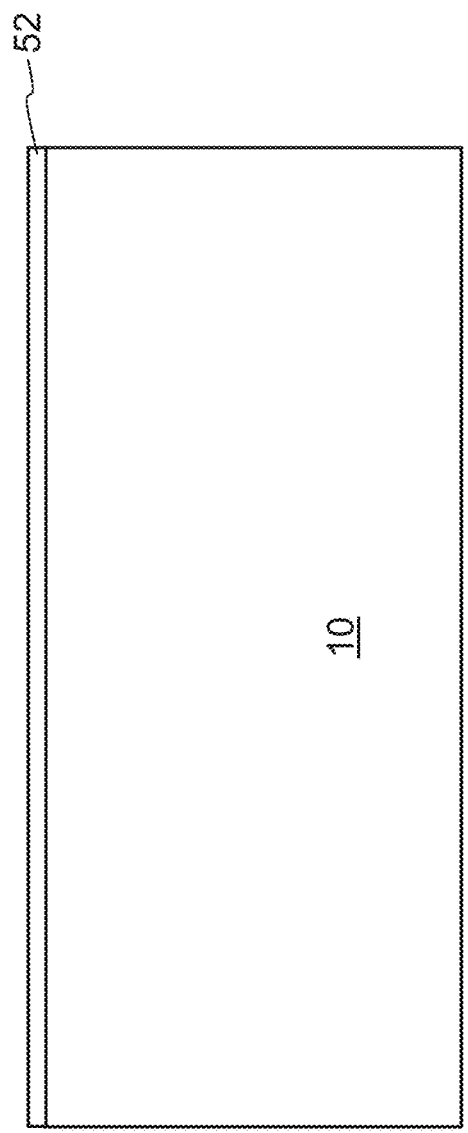
Figure 5B:
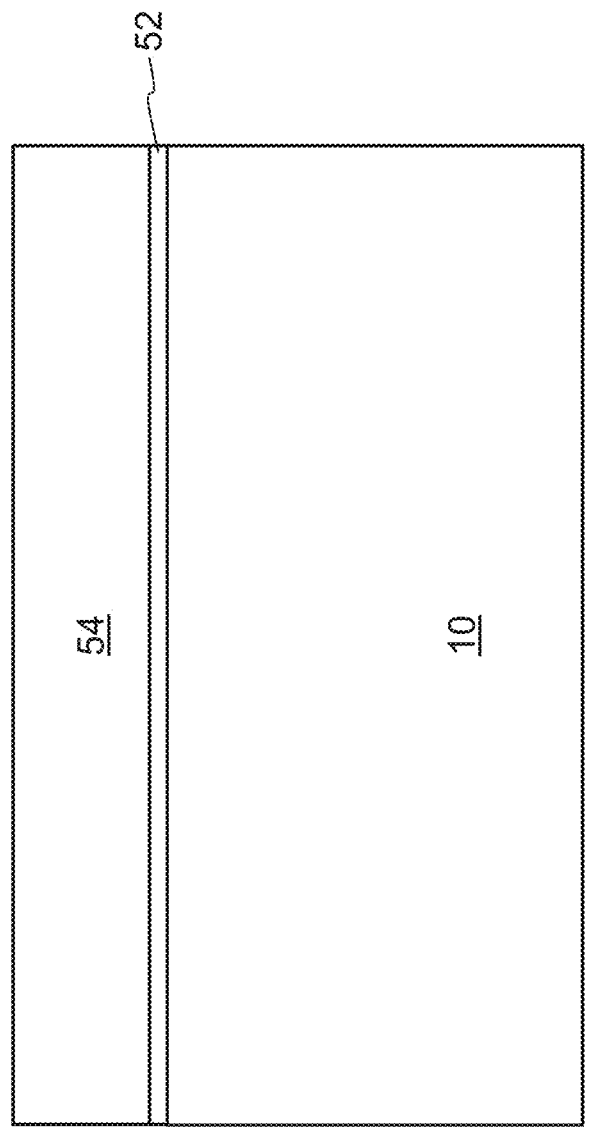
Figure 5C:
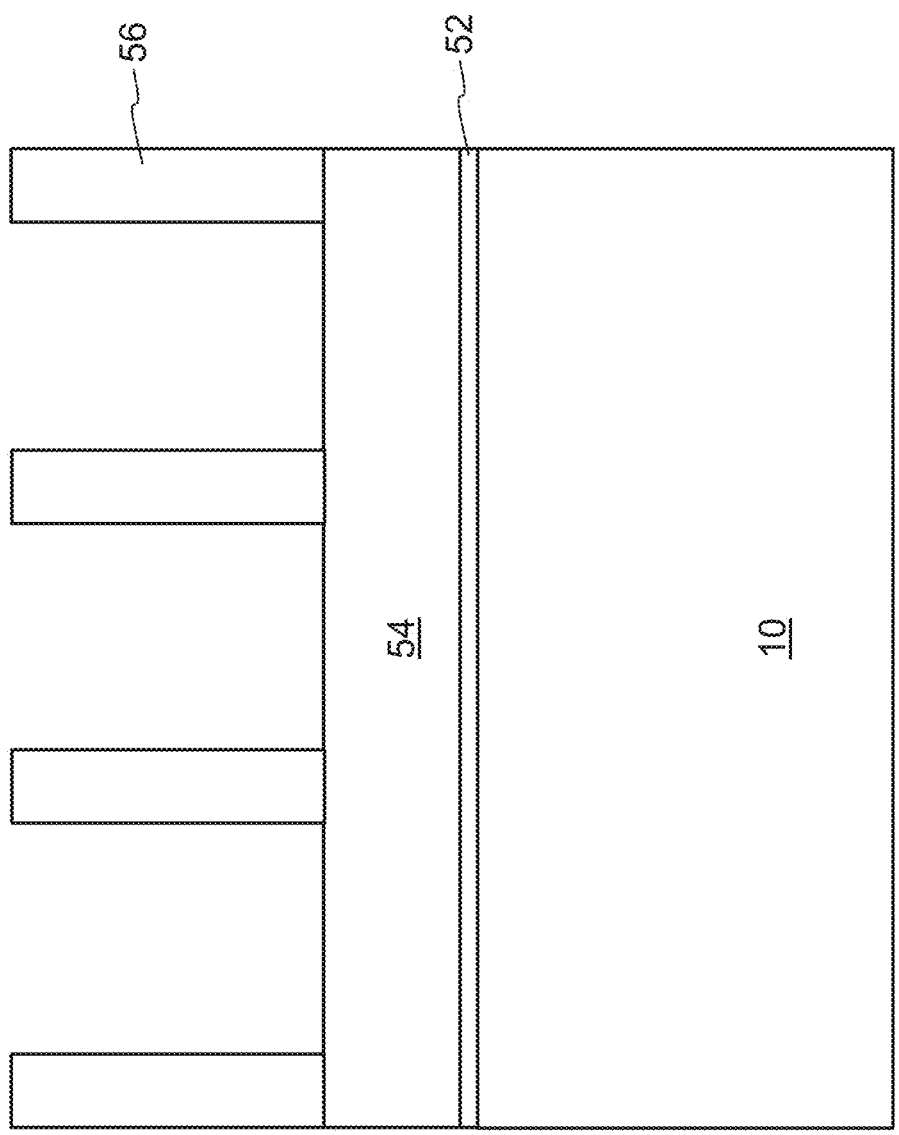
Figure 5H:
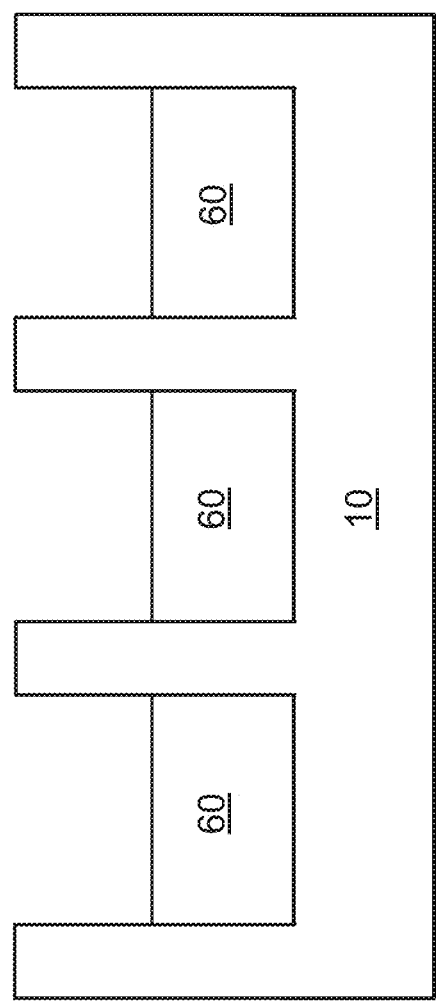

FIGS. 5A-5H are side cross sectional views of an alternate embodiment in forming the Fin-FET split gate memory cell array. These figures show processing steps that can replace the processing steps described above with respect to FIGS. 1A-1L and 2A-2L. This alternate processing defines the width of the semiconductor fins directly using lithography rather than by spacers. The process begins by forming a layer of oxide 52 on the silicon substrate 10 (FIG. 5A). A nitride layer 54 is formed on the oxide layer 52 (FIG. 5B). Photo resist 56 is deposited on the structure, followed by a photolithographic etch that leaves areas of the nitride layer 54 exposed (FIG. 5C). A nitride etch removes the exposed portions of the nitride layer 54 (FIG. 5D). The photoresist 56 is removed. An etch is used to remove exposed portions of the oxide layer 52 exposing the underlying substrate, and to remove exposed portions of substrate 10 to form trenches 58 into the exposed portions of the substrate 10 (FIG. 5E). Oxide is then deposited over the structure, followed by a chemical mechanical polish (CMP) using the nitride layer 54 as an etch stop, which fills the trenches with oxide 60 (FIG. 5F). A partial oxide etch is then performed to recess the oxide 60 in the trenches (FIG. 5G). A nitride etch is then used to remove the nitride 54, and an oxide etch is used to remove the pad oxide 52 (FIG. 5H). The process continues then using the above described steps starting with those described with respect to FIGS. 1M and 2M.

It is to be understood that the present invention is not limited to the embodiment(s) described above and illustrated herein, but encompasses any and all variations falling within the scope of any claims supported thereby. For example, references to the present invention herein are not intended to limit the scope of any claim or claim term, but instead merely make reference to one or more features that may be covered by one or more claims. Materials, processes and numerical examples described above are exemplary only, and should not be deemed to limit any claims. Further, not all method steps need be performed in the exact order illustrated. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

The invention claimed is:

1. A method of forming a non-volatile memory cell, comprising:
   forming a pair of parallel trenches into a surface of a semiconductor substrate of a first conductivity type, resulting in a fin shaped upper surface portion between the trenches having a top surface and two side surfaces;
   forming insulation material along the top surface and the two side surfaces;
   forming spaced apart first and second regions of a second conductivity type different than the first conductivity type in the fin shaped upper surface portion, with a channel region extending between the first region and the second region;
   wherein the channel region has a first portion that includes a first portion of the top surface and first portions of the two side surfaces, and has a second portion that includes a second portion of the top surface and second portions of the two side surfaces,
   forming a conductive floating gate that includes:
      a first portion that extends along and is insulated from the first portion of the top surface,
      a second portion that extends along and is insulated from the first portion of one of the two side surfaces, and
      a third portion that extends along and is insulated from the first portion of the other of the two side surfaces;
   forming a conductive control gate that includes:
      a first portion that extends along and is insulated from the second portion of the top surface,
      a second portion that extends along and is insulated from the second portion of one of the two side surfaces,
      a third portion that extends along and is insulated from the second portion of the other of the two side surfaces,
      a fourth portion that extends up and over and is insulated from at least some of the floating gate first portion,
      a fifth portion that extends out and over and is insulated from at least some of the floating gate second portion, and
      a sixth portion that extends out and over and is insulated from at least some of the floating gate third portion.

2. The method of claim 1, wherein the forming of the pair of trenches includes:
   forming a block of material over the surface of the substrate;
   etching portions of the substrate adjacent to the block of material leaving the fin shaped upper surface portion underneath the block of material.

3. The method of claim 2, wherein the forming of the block of material includes:
   forming a layer of material on the surface of the substrate;
   forming a second block of material on the layer of material;
   forming a spacer of material on the layer of material and along a side surface of the second block of material;
   removing the second block of material;
   etching portions of the layer of material adjacent to the spacer of material leaving the block of material underneath the spacer of material.

4. The method of claim 2, wherein the forming of the block of material includes:
   forming a layer of material on the surface of the substrate;
   forming photo resist over the layer of material;
   performing a photolithography exposure and etch to selectively remove portions of the photo resist leaving a block of the photo resist on the layer of material;
   etching portions of the layer of material adjacent to the block of photo resist leaving the block of material underneath the block of photo resist.

5. The method of claim 1, further comprising:
   oxidizing a top surface of the floating gate to form oxidized polysilicon such that the top surface of the floating gate becomes sloping and terminates in a sharp edge that faces and is insulated from the control gate.

* * * * *